United States Patent
Chen

(10) Patent No.: US 8,378,427 B2
(45) Date of Patent: Feb. 19, 2013

(54) HIGH SPEED IGBT

(75) Inventor: Xingbi Chen, Chengdu (CN)

(73) Assignee: University of Electronic Science and Technology, Sichuan (CN)

(*) Notice: Subject to any disclaimer, the term of this patent is extended or adjusted under 35 U.S.C. 154(b) by 485 days.

(21) Appl. No.: 12/712,583

(22) Filed: Feb. 25, 2010

(65) Prior Publication Data

US 2010/0219446 A1   Sep. 2, 2010

(30) Foreign Application Priority Data

Feb. 27, 2009 (CN) .................. 2009 1 0119961

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl. ........................ 257/378; 257/341
(58) Field of Classification Search .......... 257/335–378, 257/E21.418
See application file for complete search history.

(56) References Cited

U.S. PATENT DOCUMENTS

| | | | |
|---|---|---|---|
| 5,286,655 A | 2/1994 | Tsunoda | |
| 5,726,469 A | 3/1998 | Chen | |
| 6,998,681 B2 | 2/2006 | Chen | |
| 8,097,919 B2 * | 1/2012 | Zhang et al. ............ | 257/341 |
| 2010/0187566 A1 * | 7/2010 | Jou et al. ................. | 257/137 |
| 2010/0207205 A1 * | 8/2010 | Grebs et al. ............. | 257/334 |

FOREIGN PATENT DOCUMENTS

CN         101281907         10/2008

* cited by examiner

*Primary Examiner* — Cuong Q Nguyen
(74) *Attorney, Agent, or Firm* — Pillsbury Winthrop Shaw Pittman, LLP

(57) ABSTRACT

An IGBT with almost no tail during turning-off is formed by connection of both the base and the emitter of the BJT of the IGBT at the bottom of the chip to two regions in an area of the top surface of the chip. The two regions keep non-depleted even under a maximum voltage being applied across the collector and the base of the BJT. The current through the two regions can be controlled by a gate voltage of a place close to the active region of the MISFET of the IGBT through a surface voltage-sustaining region. The injection efficiency of minorities of the IGBT can thus be controlled.

12 Claims, 25 Drawing Sheets

HIGH SPEED IGBT

CROSS-REFERENCE TO RELATED APPLICATIONS

This application is based upon and claims the benefit of priority from the prior Chinese Patent Application No. 200910119961.3, filed Feb. 27, 2009, the entire contents of which are incorporated herein by reference.

FIELD OF THE INVENTION

The present invention relates to a technique of semiconductor high-voltage devices and power devices, more specifically to a high speed IGBT.

BACKGROUND OF THE INVENTION

It is well-known that when an IGBT (Insulated Gate Bipolar Transistor) is in the conduction state, excess minorities are injected from its emitter region into its base region and thereby the concentration of non-equilibrium carriers can be significantly higher than that of equilibrium carriers, resulting a strong conductivity modulation in base region and therefore the voltage drop under conduction is significantly decreased. FIG. 1 shows the structure of a cell of a typical n-IGBT and its equivalent circuit. It can be seen from this figure that the IGBT is a bipolar junction transistor (BJT) driven by an n-Metal-Insulation-Semiconductor Field Effect Transistor (n-MISFET), wherein the emitter E and collector C of the bipolar transistor constitute the emitter and collector of the IGBT, respectively, and the base current of bipolar transistor is the drain current of n-MISFET which is controlled by the gate electrode G. Since bipolar carriers participate in electric conduction in IGBT, the switching speed is slowed down inevitably. Especially, there is a significant current tail during the turn-off period. The conventional methods to improve the switching speed includes: employing the anode short-circuit structure; reducing the lifetime of non-equilibrium carriers in base region and diminishing the emitter injection efficiency.

FIG. 2 shows a schematic diagram of the structure of a common IGBT with anode short-circuit in Ref. [1]. When the IGBT is turned on and used for large current applications, the electrons that flow from the channel region into the base region of BJT directly flow out of the n-region at the bottom, and a voltage drop will be formed when the electrons flow through the n-region. That is to say, there is a voltage drop across p-region and n-substrate. When the voltage drop is greater than about 0.7 V, a large amount of holes are injected from p-region into n$^-$-region, and then conductivity modulation effect occurs in the base layer. When the IGBT is used for small current applications, the voltage drop across the p-region and n$^-$-substrate is smaller, which makes the injection efficiency of the IGBT emitter junction lower, and a much small amount of holes are injected into the base region. Therefore the injection efficiency of the emitter of the common anode-short IGBT will decrease as the emitter current $I_E$ decreases. When the emitter current $I_E$ decreases to a certain value, there will be no hole injected from the emitter region into the base region, thus diminishing the phenomenon of current tail. The methods such as using technology of controlling lifetime of non-equilibrium carriers as well as reducing the emitter injection efficiency for increasing the switching speed are to some extent by decreasing the current produced by non-equilibrium carriers.

However, the above methods are at the expense of the conductivity modulation effect when the device is in the conduction state, which makes the increase of the voltage drop in the on-state. In addition, the methods mentioned above can not entirely eliminate the current tail when the device is turning off, but rather to achieve a tradeoff between switching speed and on-state voltage drop.

REFERENCES

[1] Tsunoda, "Method of Manufacturing a semiconductor device of an anode short circuit structure", U.S. Pat. No. 5,286,655.
[2] X. B. Chen, U.S. Pat. No. 6,998,681 B2, or Chinese patent ZL 200310101268.6.
[3] X. B. Chen, Chinese patent ZL 200810097388.6.
[4] X. B. Chen, "Surface voltage sustaining structure for semiconductor devices", U.S. Pat. No. 5,726,469, or Chinese patent ZL 95108317.1.
[5] X. B. Chen, U.S. Pat. No. 6,998,681 B2, or Chinese patent ZL 200310101268.6.

SUMMARY OF THE INVENTION

As lots of examples have been shown in the figures and their descriptions, an IGBT with the injection efficiency of its BJT adjustable and thereby almost no current-tail of the IGBT in turning-off is achievable. The present invention can be summarized as follows.

1. An IGBT made on a semiconductor substrate (see n-region 101 in all figures where n-region 101 is appeared) of a first conductivity type having two main surfaces, comprising at least a cell of a metal-insulator-semiconductor field effect transistor, MISFET (see n$^+$-region 106, shaded area 130, p-region 103, n-region 101, n-region 102 and $G_0$ in FIG. 3) of first conductivity type (n-type semiconductor in all figures of structures) and at least a cell of a bipolar junction transistor BJT (see p-region 110, n-region 102, n-region 101 and p-region 103 in FIG. 3) of a second conductivity type (p-type semiconductor in all figures of structures), wherein the cell of MISFET of the first conductivity type has at least one cell of source-body region (see p-region 103 in FIG. 3) of semiconductor of second conductivity type underneath the first main surface (it means the upper surface in all figures) and at least one source region (see n$^+$-region 106 in FIG. 3) of semiconductor of the first conductivity type in the source-body region, and a part of the source-body region and a part of the source region are connected by a conductor as a source electrode (see C in all figures where C is appeared) of the MISFET; an insulator layer (see shaded area 130 in FIG. 3) covering on the surface of part of the source region, a part of the source-body region and a part of the substrate, and there is a conductor covering on the insulator layer as the gate electrode (see $G_0$ in all figures where $G_0$ is appeared) of the MISFET;

the cell of BJT of the second conductivity type has a base region in the substrate, at least one emitter region (see p-region 110 in all figures where p-region 110 is appeared) being a semiconductor region of second conductivity type in the second main surface (the bottom surface in all figures of structures) and at least one collector region (see p-region 103 and p-region 104 in FIG. 3); wherein the emitter region is adjacent at least a base region, both the emitter region and the base region have their own electrodes as emitter and base on the second main surface, respectively, (see E and B in FIG. 3), the collector region is the source-body region of the MISFET, a collector (see C in all figures where C is appeared) of BJT is the source electrode of the MISFET;

the IGBT has an edge termination region at first main surface separating entire source-body regions of the cell(s) of MISFET of the IGBT from a neutral base region (right part of the dash-dotted line in all figures), the neutral base region keeps neutral rather than depleted even under a maximum reverse bias voltage applied across the emitter and the collector;

at least a portion of the edge termination region has a section of largest voltage (see dashed block 001 in FIG. 4) contacting directly to the source-body region of the MISFET, a section of transit region contacting directly to the section of largest voltage on the one end and contacting directly or through a field-stop region of a heavily doped semiconductor of first conductivity type to the neutral base region on the other end;

the section of transit region has at least a bottom layer (see $p_1$-region 888 in FIG. 4-6 and FIG. 13-17 or p-region 168 in FIG. 7-12 and FIGS. 19, 21, 22 and 24) of second conductivity type starting from the section of largest voltage to a place with a distance to the neutral base region, wherein the distance is smaller than a distance from the one end to the other end of the transit region;

the voltage is with respect to the neutral base region, and the largest voltage is a negative value when the semiconductor of first conductivity type is n-type, the largest voltage is a positive value when the semiconductor of first conductivity type is p-type;

a low-voltage circuit region (see region 200 in figures where it shows 200) is located in the neutral base region;

the low-voltage circuit region has at least two semiconductor regions (see p-region 281 and p-region 282 in the figures where it shows 281 and 282, or p-region 201 and p-region 202 in the figures where it shows 201 and 202), each lead out an electrode as two output terminals of the low-voltage circuit region, and the two terminals are each connected to the emitter and the base of the second main surface of the IGBT through outer connections;

the low-voltage circuit region has at least one electrode terminal (see, e.g., F in the figures where it appears F) as control terminal(s), and the voltage drop across two output terminals of the low-voltage circuit is controlled by applying a voltage across the control terminal(s) and the neutral base region.

Thus, the injection efficiency of its BJT is at least adjustable by an external applying voltage across the control terminal(s) and the neutral base region.

2. Further, in order to obtain a voltage across the control terminal(s) and the neutral base region by the terminals inherently in a conventional IGBT instead of an external one, a variation lateral doping technique is used, so that a signal from the active region of the IGBT can be transferred to the low-voltage circuit at any value of the reverse bias voltage being applied across the collector and the emitter. It is proposed that the IGBT under a maximum reverse bias voltage being applied across the collector and the emitter of the IGBT, the section of transit region emits an effective electric flux density of the second conductivity type to the base region; the effective electric flux density gradually or step-wisely decreases from a value of close to a value of $qD_0$ to a value of close to zero according to a distance from, the cell to the neutral base region along the surface; wherein q stands for the charge of an electron and $D_0$ is the density of depleted ionized impurities of second conductivity type of the heavily doped region of a one-sided abrupt parallel-plane junction made by the same base under its maximum reverse applied voltage;

the effective electric flux density of second conductivity type represents the total numbers of electric flux of ionized impurities in an area of the surface divided by the area; the dimension of the area in any direction along the surface is smaller than the depletion depth of the substrate of a one-sided abrupt parallel-plane junction made by the same substrate under its maximum reverse applied voltage, but is larger than the thickness of the transit region.

3. Further, in order to produce a signal for the control terminal(s), it is proposed that close to the active region of the IGBT, the section of largest voltage has two MISFET cells, both having the same structure of the MISFET cell of the IGBT (see FIGS. 7, 8, 10, 11, 12, 19, 21, 22 and 24);

wherein both source electrodes of a first MISFET cell and a second MISFET cell are contacted directly to their own source regions and source-body regions;

wherein the source electrode (see C in all figures unless those no C is appeared) of the first MISFET cell is connected to the source-body region (see p-region 121 in FIGS. 7, 8, 10, 11, 12, 19, 21, 22 and 24) of the IGBT through inner connection; whereas the source electrode (see electrode 030 in all figures unless those no 030 is appeared) of the second MISFET cell is not connected to anything;

wherein both gate electrodes of the first MISFET cell and the second MISFET cell are contacted together and be applied by the same gate voltage (see $G_0$ in FIGS. 7, 8, 10, 11, 12, 21, 22 and 24) of the IGBT or by other voltage (see $G_1$ FIG. 19).

4. Still further, in order to produce a signal for the control terminal(s), it is proposed another method to produce a signal for the control terminal(s). This method is to use a lateral MISFET close to the active region of the IGBT. That is, to use two layers of semiconductor of opposite conductivity types in the transit region (see n-region 880 and $p_1$-region 888 in FIG. 4, 5, 6, 14, 15, 17), where the section of largest voltage has an active region of a lateral MISFET of first conductivity type; the lateral MISFET has a source-body region surrounding the cell(s) of the MISFET of the IGBT, the lateral MISFET has a source electrode (see C in FIG. 4, 5, 6, 14, 15, 17) connected through inner connection with the source electrode of the MISFET cell of the IGBT;

the lateral MISFET has a gate electrode (see $G_1$ in FIG. 4, 5, 6, 14, 15, 17) being connected through inner connection with the gate electrode of the cell of the IGBT or being an independent electrode; the lateral MISFET has a drift region (see 880 in FIG. 4, 5, 6, 14, 15, 17) being the layer(s) of the first conductivity type of the transit region.

5. Still further, in order for transmitting the signal to the control terminal(s), five methods have been proposed in this invention as 1), 2), 3), 4) and 5) as follows:

1). The section of transit region has at least one floating region, the floating region(s) is (are) a heavily doped region of semiconductor of second type (see p-region 300 in FIGS. 7, 8, 9, and 10) and/or semiconductor of first type (see n-region 126 in FIGS. 11, 12 and 13) near the neutral base region and underneath the first main surface;

the floating region(s) has(have) an undepleted region under a maximum reverse bias voltage applied across the emitter and the collector;

an electrode is covered on the floating region or covered on both (see electrode 020 in FIG. 8) the floating region in the transit region and an insulator layer on the first main surface;

the electrode of the floating region is connected to the control terminal of the low-voltage circuit through an inner connection.

2). A control terminal of the low-voltage circuit region is connected to the field-stop region (see n-region 400 in FIG. 4, 5, 6).

3). A control terminal of the low-voltage circuit region is connected to both the field-stop region and the floating region (s).

4). The transit region has two floating regions: a first floating region (see p-region 601 in FIG. 19 and FIG. 17) of semiconductor of second conductivity type is located close to the neutral base region and a second floating region of semiconductor of second conductivity type (see p-region 630 in FIG. 19) or of semiconductor of first conductivity type (see n-region 604 in FIG. 17) is located between the first floating region and the remaining transit region;

wherein the first floating region has an electrode on its top, the electrode of the first floating region is connected to the control terminal (see F in FIG. 19 and FIG. 17) through an inner connection; wherein inside the first floating region is a semiconductor region of first conductivity type (see n-region 602 in FIG. 19 and FIG. 17) and has an electrode on its top and connected thereby to the second floating region (see 630 in FIG. 19 and 604 in FIG. 17) through an inner connection; wherein the first floating region has still another semiconductor region of second conductivity type (see p-region 603 in FIG. 19 and FIG. 17) inside the semiconductor region of first conductivity type and has an electrode on its top and connected thereby to the terminals connected to the base of the low-voltage circuit region;

5). An insulator layer (see shaded area 081 in FIGS. 21, 22 and 24) covers on the first main surface in the section of transit region near the neutral base region, a conductor (see 080 in FIGS. 21, 22 and 24) covers on the insulator layer and connected to the control terminal (see 1200 in FIGS. 21, 22 and 24) and also connected through a resistance (see $R_j$ in FIG. 21) to the field stop region (see n-region 400 in FIGS. 21, 22 and 24);

wherein the resistance is a passive one or an active one formed by a device.

6. Moreover, two examples of low-voltage circuits are proposed in this invention:

First, the two output terminals of low-voltage circuit are a source electrode (see E in FIGS. 7, 8, 10, 11 and 12) and a drain electrode (see B in FIGS. 7, 8, 10, 11 and 12) of a low-voltage MISFET respectively and the control terminal is connected to a gate of the low-voltage MISFET.

Second, the two output terminals of low-voltage circuit are a emitter electrode (see E in FIGS. 4, 5 and 6) and a collector electrode (see B in FIGS. 4, 5 and 6) of a low voltage bipolar transistor respectively and the control terminal is connected to the neutral base region.

7. Finally, a method of implementation of the power supply of the low-voltage circuits produced by the IGBT itself is proposed (see the description of FIGS. 7, 8 and 9). That is a heavily doped region (see p-region 300 in FIGS. 7, 8 and 9) implemented in the section of transit region near the neutral base region, the heavily doped region is not fully depleted under a maximum reverse bias voltage applied across the collector and the emitter of the IGBT; a neutral region in the heavily doped region in the section of transit region near the neutral base region serves as a terminal of a primary power supply of the low-voltage circuit in the neutral base region.

DESCRIPTION OF THE PREFERRED EMBODIMENTS

In this section, the technology schemes of the present invention will be described and illustrated in detail with reference to the drawings, wherein the illustrative embodiments of the present invention will be demonstrated. It is noted that the semiconductor devices proposed in the present invention refer to not only the silicon devices, but also other semiconductor materials devices.

Figure 1:
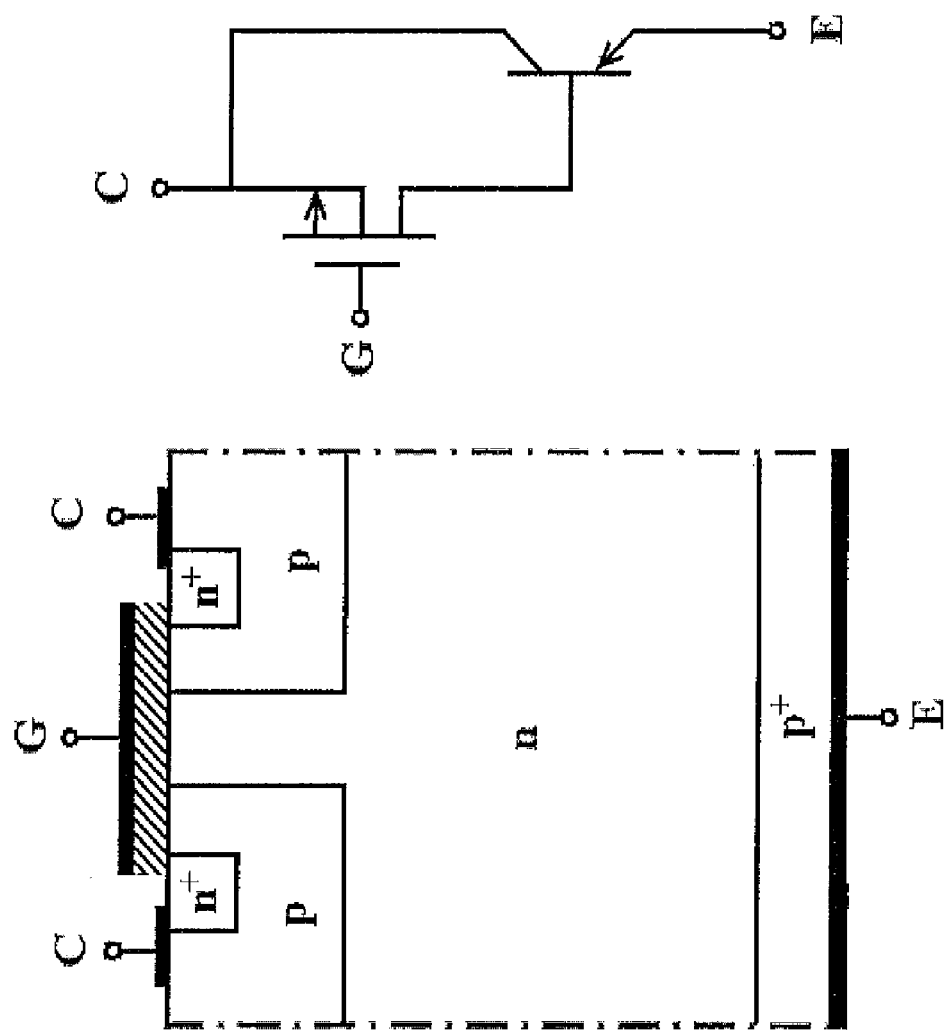
FIG. 1 shows the structure of a common n-IGBT of conventional technology and its equivalent circuit.
Figure 2:
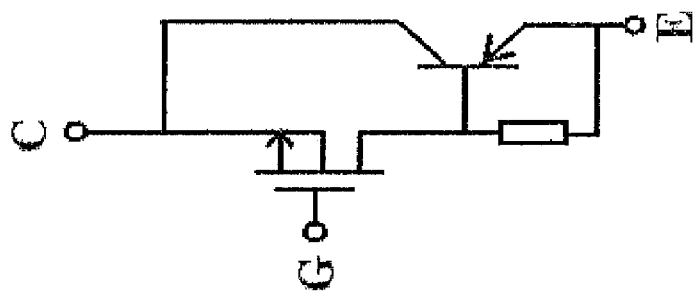
FIG. 2 shows the structure of a common IGBT with anode short-circuit by using the conventional technology and its equivalent circuit.
Figure 2:
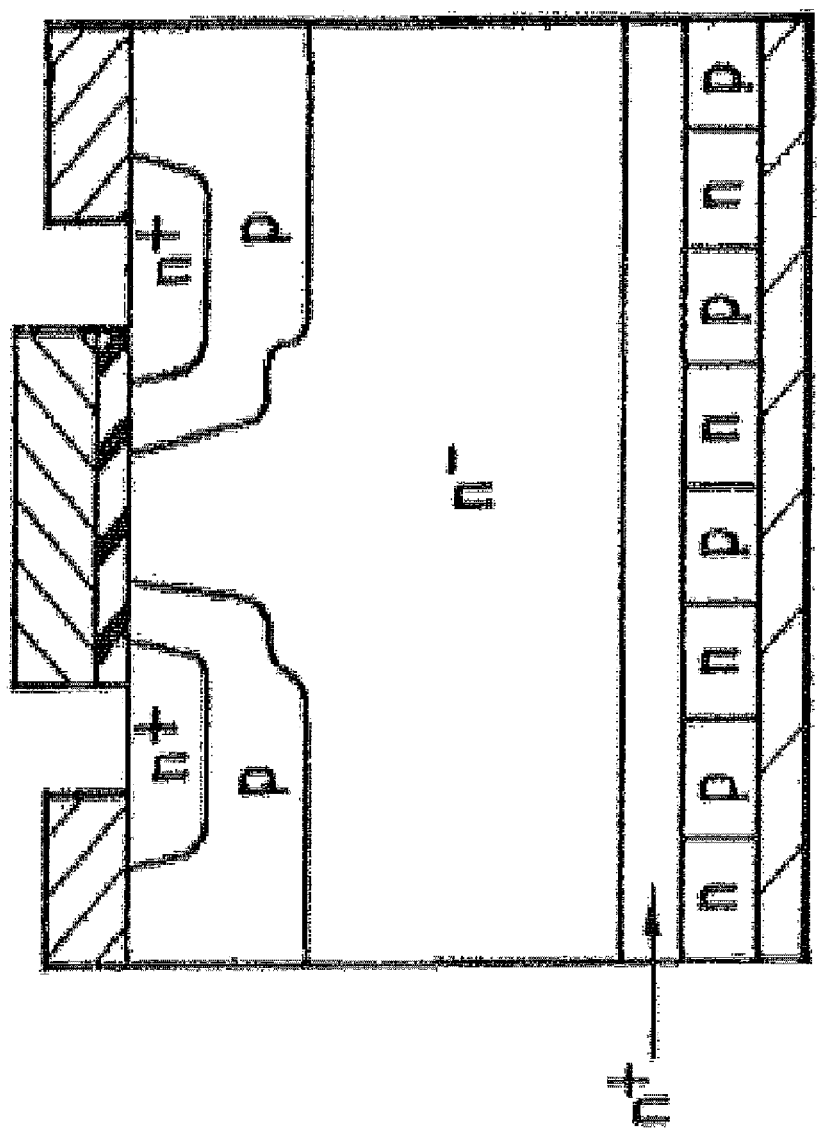
Figure 3:
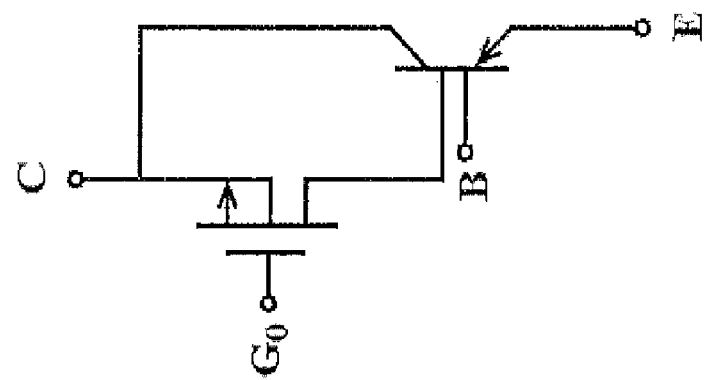
FIG. 3 shows a schematic cross-sectional view of a cell of an n-IGBT proposed in present invention, which has an additional base electrode B (the figure shown on the right is its equivalent circuit).
Figure 3:
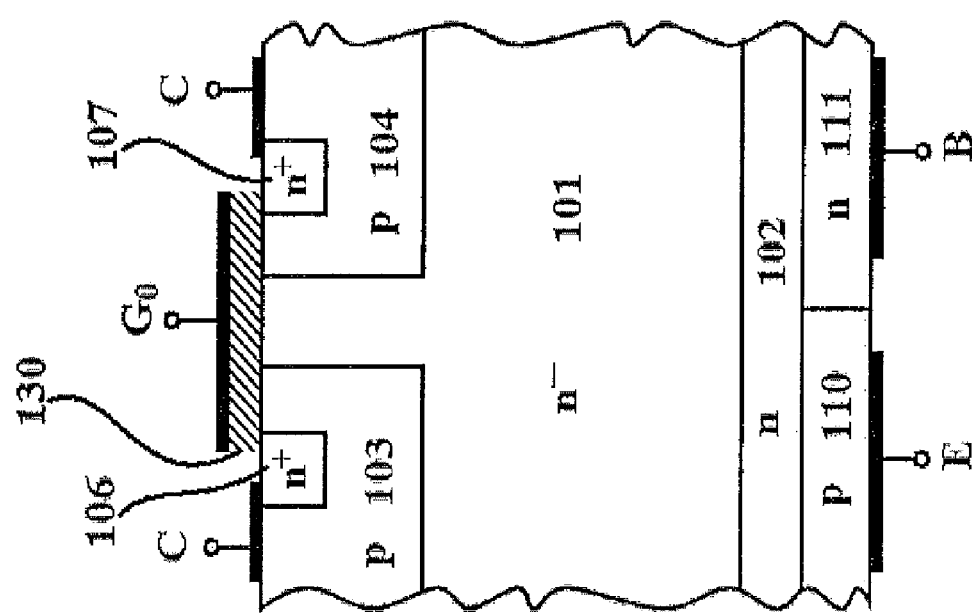

FIG. 3 shows a schematic diagram of the structure of the n-IGBT cell used in the present invention and its equivalent circuit. In FIG. 3, $G_0$ is the gate of the present an IGBT, C is the collector and E is the emitter. It should be noted that an electrode B of the base is added in FIG. 3, which is different from the common anode-short structure shown in FIG. 2. Once the voltage of $G_0$ is higher than the threshold voltage $V_{th0}$, the IGBT is turned on. At a moment, while the value of the voltage drop across the electrodes E and B is not smaller than the voltage needed to inject a significant amount of non-equilibrium holes from p-region 110 into n-region 102, there will be electrons flowing from the collector C through the $n^+$-region 106, the channel region underneath the gate, $n^-$-region 101, to n-region 102 then into p-region 110. At the same time, there are holes flowing from p-region 110 through n-region 102 to $n^-$-region 101, thus causing a strong conductivity modulation effect in $n^-$-region 101, which greatly decreases the on-state voltage drop $V_{EC}$. When the IGBT is turned off, if the value of the voltage drop across the electrodes E and B is smaller than that needed to inject a significant amount of non-equilibrium holes from p-region 110 into the n-region 102, there will be no non-equilibrium holes being injected from the emitter region into the base region continuously during the turning-off, thus eliminating the current tail during the turning-off.

Figure 4:
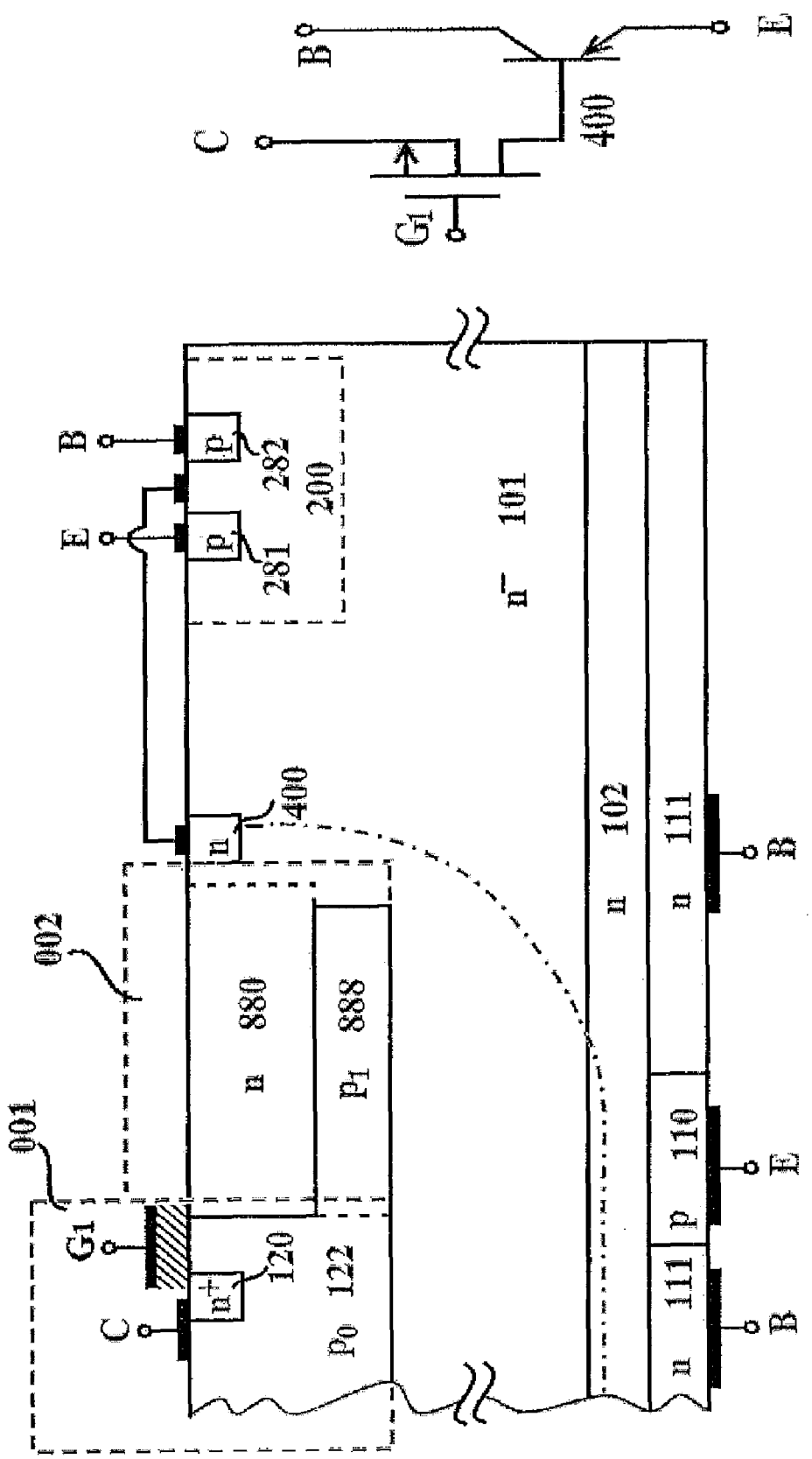
FIG. 4 schematically shows a method by using a bipolar transistor to regulate the minority injection efficiency of the emitter region of an IGBT (the figure shown on the right is the equivalent circuit of the structure in upper part).

The left part of FIG. 4 shows a structure to implement the above function. The right part of FIG. 4 shows the equivalent circuit of it. The active region 001 shown in the dashed block of n-MISFET is in the upper surface of the $n^-$-substrate 101, and the IGBT cell used in the present invention shown in FIG. 3 are on the left of the active region. Unless in particular cases, the cells of an IGBT are not shown in the figures of the present invention. As shown in the dashed block in the section of transit region in the figure, there is a surface voltage-sustaining region 002 composed of $p_1$-region 888 and n-region 880 on the right of the active region 001, and there is a field-stop region 400 at the right end of the surface voltage-sustaining region which can still maintain neutral rather than be depleted when the voltage drop across the emitter E and the collector C of the IGBT reaches its maximum. The dash-dotted line in the figure stands for the boundary of the depletion region in n-region 101 when the IGBT is reverse-biased. Under a reverse-biased voltage being a certain value, the portion of $n^-$-region 101 on the upper left of the dash-dotted line is fully depleted, and the portion on the lower right part of the dash-dotted line remains fully neutral.

If the surface voltage-sustaining region 002 is implemented according to the methods in Ref. [2], the depletion region can reach the left side of n-region 400 under a value of reverse-biased voltage of emitter-collector $V_{EC}$ varying in a wide range. Only when the value of $V_{EC}$ is very small, then the depletion region can not reach the left side of n-region 400. There is a low-voltage circuit region 200 beyond the depletion region, where it is always in a neutral (undepleted) region no matter what the value of $V_{EC}$ is.

Note that there is a p-region 110 and an n-region 111 underneath the n-substrate 101, and p-region 110 and n-region 111 each has an electrode at the bottom, E and B, respectively. Needless to say, p-region 281, n-substrate in region 200 and p-region 282 constructs a p-n-p bipolar transistor in region 200. The p-regions 281 and 282 are the emitter region and the collector region of the transistor, respectively. The n-region between p-regions 281 and 282 is the base region of the transistor, which is connected to n-region 400 through the inner connection. Note also that p-regions 281 and 282 in the low-voltage circuit region 200 in the upper surface each has an electrode as the output terminals of the low-voltage circuit, and the two terminals are connected to the emitter E and the base B at the bottom through their own outer connections. It should be pointed out here that the low-voltage circuit in this figure is realized by using only one transistor. In fact, the circuit can also be realized by using more than one transistor in parallel connection, the practical usage depends on the drive capability of the transistor.

During the turning-off of an IGBT, the voltage across the electrode E and the electrode C is positive. At this moment, if the voltage applied to the gate electrode $G_1$ is larger than the threshold voltage of the n-MISFET $V_{th1}$, there will be a path for the flow of electrons from the electrode C to the n-region 400 through $n^+$-region 120, the channel region underneath the gate and n-region 880. The current produced by such a flow of electrons serves now as a base current of the transistor in 200. Then, the transistor in 200 is in conduction state and the voltage drop across p-region 281 and p-region 282 becomes very small. Thereupon, the injection of the minorities from emitter region 110 to base region 101 is significantly reduced and the current tail during the turning-off of the IGBT is diminished to a large extent.

Similarly, when the IGBT is turned on or just before turned-on, if the voltage applied to the gate electrode $G_1$ is smaller than the threshold voltage of the n-MISFET, $V_{th1}$, the n-MISFET does not conduct. That is to say, there is no base current in the bipolar transistor in the low-voltage circuit region 200, and this means that the bipolar transistor is not in the conduction state and the voltage drop across E-B junction can not be clamped. Evidently, a significant injection of minorities from p-region 110 into $n^-$-region 101 is not been obstructed during the turning-on of the IGBT and a strong conductivity modulation in n-region 101 can be formed.

Figure 5:
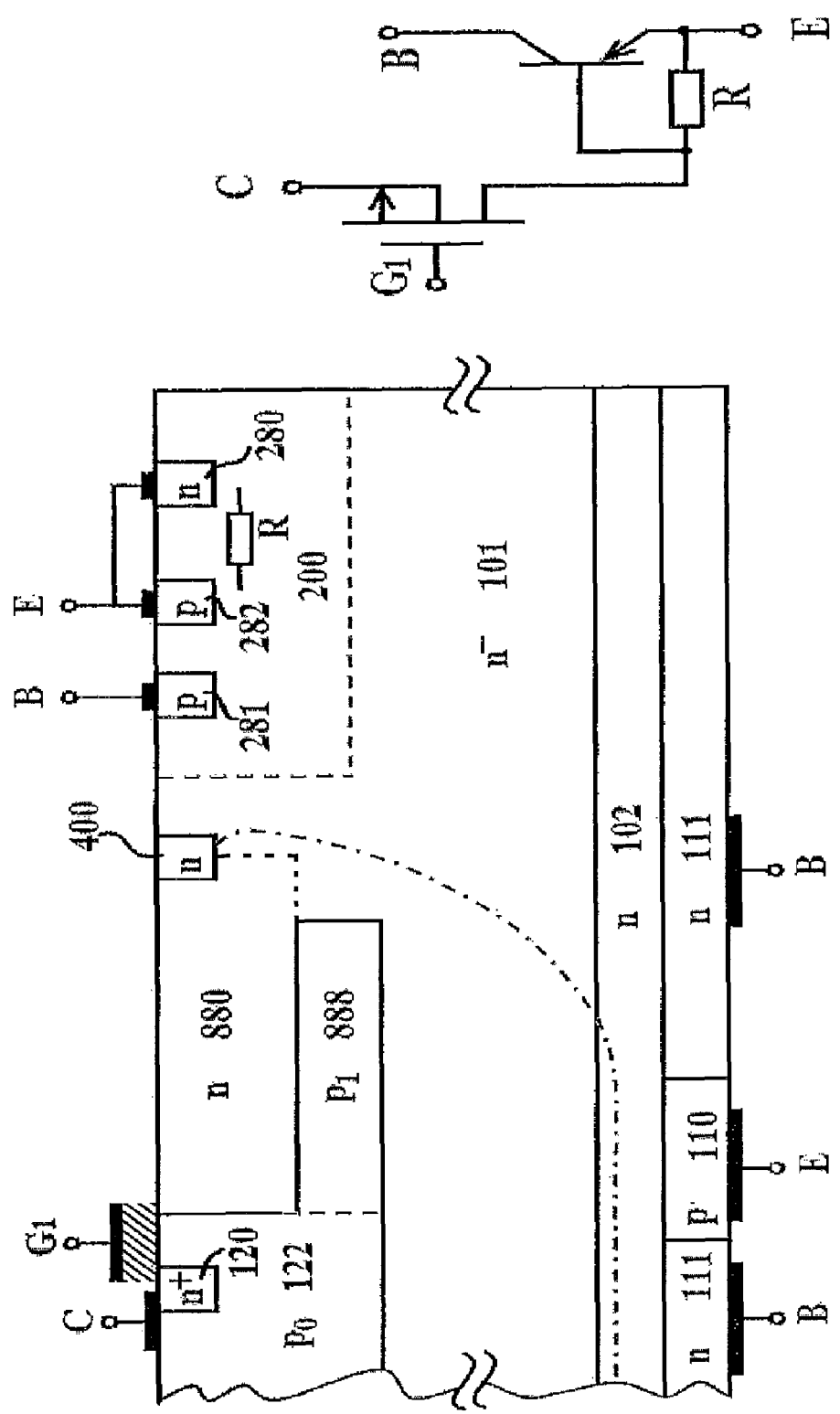
FIG. 5 schematically shows another method by using a bipolar transistor to regulate the minority injection efficiency of the emitter region of an IGBT (the figure shown on the right is the equivalent circuit of the structure in upper surface).

The left part of FIG. 5 shows another method to modulate the emitter injection efficiency of an IGBT. The right part of FIG. 5 shows the equivalent circuit of the upper surface of the left part of FIG. 5. In this figure, n-region 400 has always a neutral region even when the voltage across the emitter E and the collector C of the IGBT reaches the maximum. A low-voltage circuit region 200 is on the right of n-region 400. The low-voltage circuit has a bipolar transistor in region 200, whose emitter region and collector region are p-region 282 and p-region 281, respectively. In addition, there has a resistance marked by R between p-region 282 and an n-region 280, which is formed by the substrate area around p-region 282. The n-region 280 is connected to the p-region 282 through a conductor outside of the semiconductor. During the turning-off of the IGBT, when the voltage applied to the gate electrode $G_1$ is larger than the threshold voltage of the n-MISFET $V_{th1}$, the electrons flowing from the electrode C through the channel region underneath the gate electrode $G_1$ and n-region 880 would reach n-region 280 through R. That is to say, there is a voltage drop across p-region 282 and the substrate area nearby. When the voltage drop is higher than 0.7V, the transistor composed of p-region 282, p-region 281 and the n-substrate between them is in the conduction state, so the voltage drop across the emitter E and the base B at bottom is limited to a certain value. Roughly speaking, there is no injection of the non-equilibrium carriers when the value of the voltage is smaller than about 0.5V. Therefore a regulation of the emitter injection efficiency of the IGBT by the control of the voltage of the electrode $G_1$ can be realized.

Figure 6:
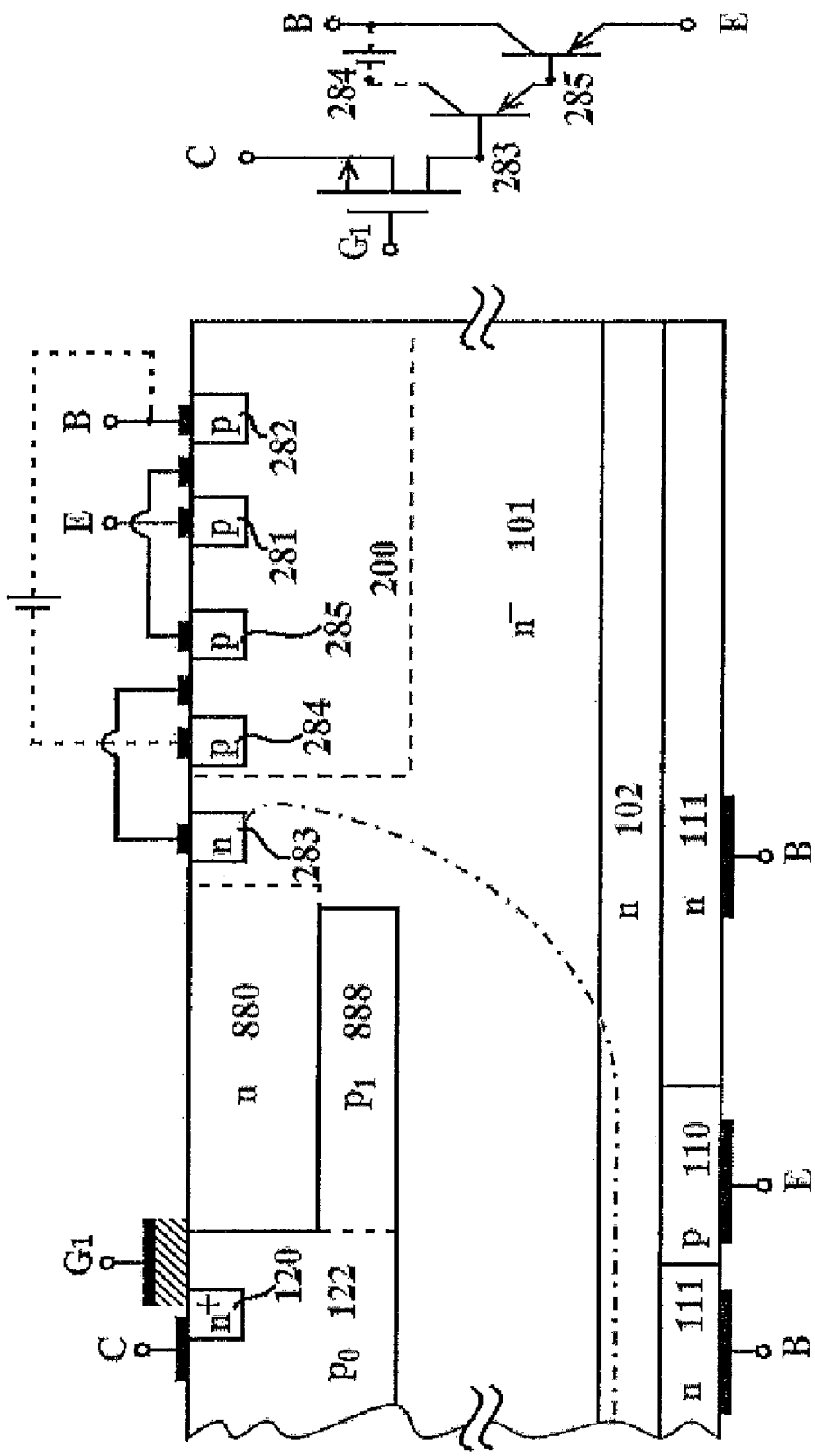
FIG. 6 schematically shows a method by using a CC-CE circuit to modulate the minority injection efficiency of the emitter region of an IGBT (the figure shown on the right is the equivalent circuit of the structure in upper surface).

However, when the IGBTs as shown in FIG. 4 and FIG. 5 are used in the high-power applications, the electron flow that starts from the electrode C through surface voltage-sustaining region and reaches the region 200 is probably insufficient for reducing the voltage drop across electrode E and electrode B to a desired value. For this case, the CC-CE circuit based on FIG. 4 can be used as shown in FIG. 6. A pnp transistor is driven by the current that flows through surface voltage-sustaining region, whose emitter region and collector region are p-region 285 and p-region 284, respectively. The current through 285 serves then as the base current of another pnp transistor, which is composed of p-region 281, p-region 282 and part of the substrate area between them, where p-region 281 and p-region 282 are the emitter region and collector region respectively. Thus, the current through p-region 285 is amplified by the transistor. Both p-regions 281 and 282 have a metal electrode covering on the upper side and connecting with the electrode E and B at the bottom through their own external connection respectively. Compared with FIG. 4, the low-voltage circuit shown in FIG. 6 can clamp the voltage of the two output terminals to a smaller value, thus the injection efficiency of the emitter can be reduced significantly during the turning-off of the IGBT.

The circuit shown in FIG. 6 needs an additional low-voltage power supply, which can be conveniently implemented by using the methods described in Ref. [3]. A structure to implement the low-voltage power supply will be proposed in the present invention shown as the p-region 300 in the following FIG. 7.

Figure 7:
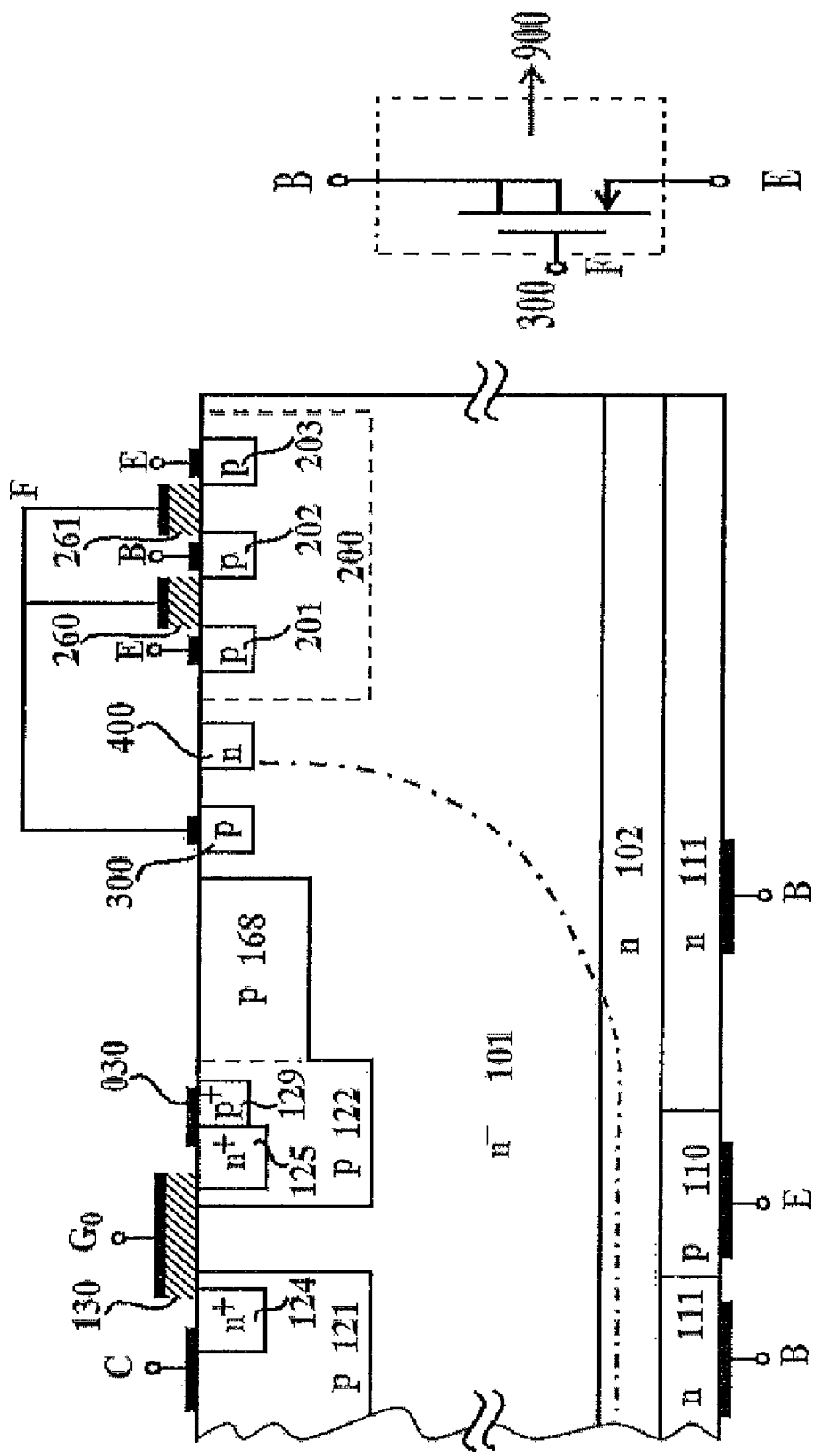
FIG. 7 is a schematic diagram of a method by using the surface voltage-sustaining region to induce a control voltage which is close to the potential of the neutral region in 200 (the figure shown on the right is the equivalent circuit of the low-voltage circuit).

An n-region 880 is required to implement in the surface voltage-sustaining region in the methods shown in FIGS. 4-6, which makes the technology more complicated. Another method shown in FIG. 7 to make the injection efficiency adjustable is also proposed in the present invention. The left part of FIG. 7 shows a specific method to control the low-voltage circuit by using the control voltage which is induced by the surface voltage-sustaining region and has a similar potential with that of the neutral zone 200. The right part of FIG. 7 shows its equivalent circuit of controlling. In this figure, the p-region 168 between the collector C and n-field-stop region 400 is the surface voltage-sustaining region described in Ref. [4]. There is a p-region 300 at the end of the surface voltage-sustaining region which is near the n-region 400. The circuit in the block 200 enclosed by the dotted line is only a simple low-voltage circuit of MISFET, and this figure shows just two p-MISFETs 900 in parallel connection, where p-region 202 is their common drain region, and connected with the electrode B through outer connection and p-region 201 and p-region 203 are their source regions. The electrodes of these two p-regions 201 and 203 are shorted and connected with the electrode E through outer connection. F is their common gate electrode, which is connected with p-region 300 through inner connection. At the beginning of the turning-off of the IGBT, a potential which is slightly lower than the substrate region in 200 is induced in p-region 300, which can make the p-MISFETs 900 conducted. As mentioned before, if the surface voltage-sustaining region is implemented by using the method in Ref. [2], the corresponding negative voltage with respect to the substrate can be induced in p-region 300 within a wide range of varying of $V_{EC}$. When the negative voltage is lower than the threshold voltage of the p-MISFETs 900, $V_{th2}$, the p-MISFETs 900 are turned on. After p-MISFETs 900 have been turned on, the values of the potentials of the source region and drain region have not too much difference, which makes p-region 110 and n-region 111 shorted, and the injection of non-equilibrium carriers from p-region 110 into n⁻-region 101 would be prevented. As the turning-off of the IGBT is a dynamic process, the speed of charging and discharging of the gate capacitance of p-MISFETs should be taken into account when voltage is induced in p-region 300. Generally speaking, more p-MISFETs are needed in parallel connection in order to gain a better effect of short circuit. However, the parallel connection of more p-MISFETs will lead to the increase of gate capacitance, resulting the voltage needed to control the gate of p-MISFETs can not be achieved fast enough by p-region 300. However, this problem can be solved in sub-micron technology, where the channel length of the p-MISFETs can be further reduced, the gate capacitance can be reduced at the same time with increasing the ratio of width to length and thereupon the voltage needed to control the gate of p-MISFETs can be induced fast enough by p-region 300.

There are two capacitors in the structure shown in FIG. 7, which would cause a time delay in turning-on process of the IGBT. First, in the turning-off process of the IGBT, p-region 300 is partially depleted in the edge of the junction with n⁻-region 101, thus the voltage of the neutral zone of p-region 300 is negative with respect to the substrate. However, during the turning-on of the IGBT, the voltage of p-region 300 should be changed to zero or a very small negative value with respect to the substrate. This change actually is a process as follows. During turning-on of the IGBT, an electron current starting from collector C through n⁺-region 124 and the channel region underneath the gate gets into n⁺-region 125, then it is turned into an hole current through the electrode 030. The hole current flows through the p⁺-region 129 and the surface voltage-sustaining p-region 168 and eventually get into p-region 300, forming the only path for supply the holes to the p-region 300. On the other hand, the part from the gate F of p-MISFETs 900 to the neutral zone in 200 is equivalent to a capacitor, and the part from the p-region 300 to the region outside the depletion zone is also equivalent to a capacitor. Charging or discharging of these two capacitors needs time. Therefore, during the transient process of the turning-on of the IGBT, the p-MISFETs 900 would stay in the turn-on state for a period of time. As a result, there is no fast injection of non-equilibrium carriers from p-region 110 into n⁻-region 101 to form the conductivity modulation effect, so the time of turning-on, $t_{on}$, of the IGBT would be longer.

Figure 8:
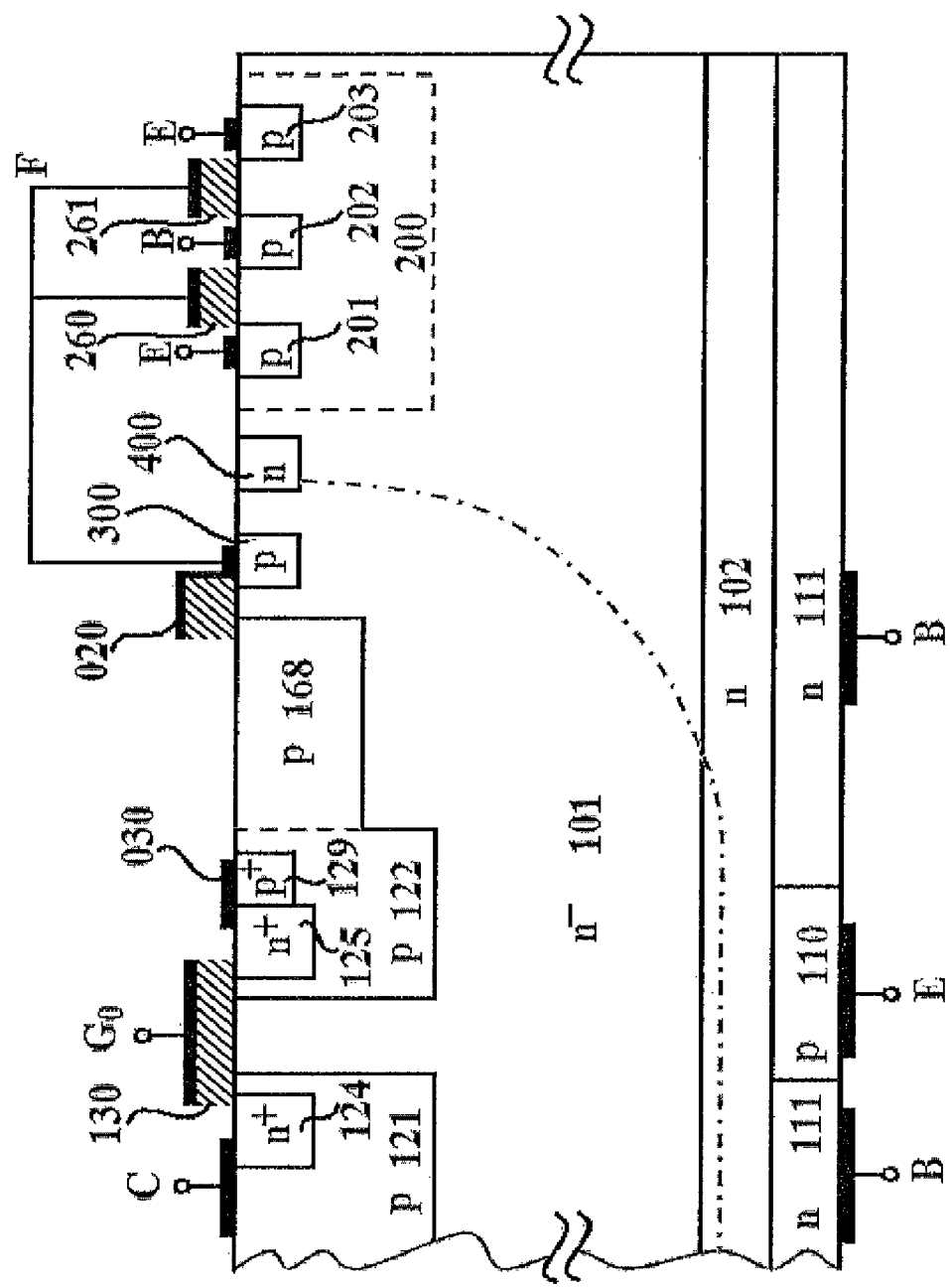
FIG. 8 is a schematic diagram of an improved method based on the one shown in FIG. 7.

FIG. 8 shows an improved structure based on the one shown in FIG. 7 to solve this problem. Compared with the device shown in FIG. 7, a gate electrode 020 of MISFET structure is introduced in FIG. 8. When the IGBT is turned on, the voltage across the electrode E and the electrode C decreases to a small value so that the voltage of the p-region 300 is negative with respect to the electrode C. Then the p-MISFET, which consists of p-region 168, p-region 300 and the electrode 020, is gate-drain shorted, the conduction capability of holes from collector C into p-region 300 is increased, and the time delay of the change of the gate voltage of p-MISFETs (called as 900 and shown in the right part of FIG. 7) is decreased, therefore, the turn-on speed of the IGBT is also increased.

Figure 9:
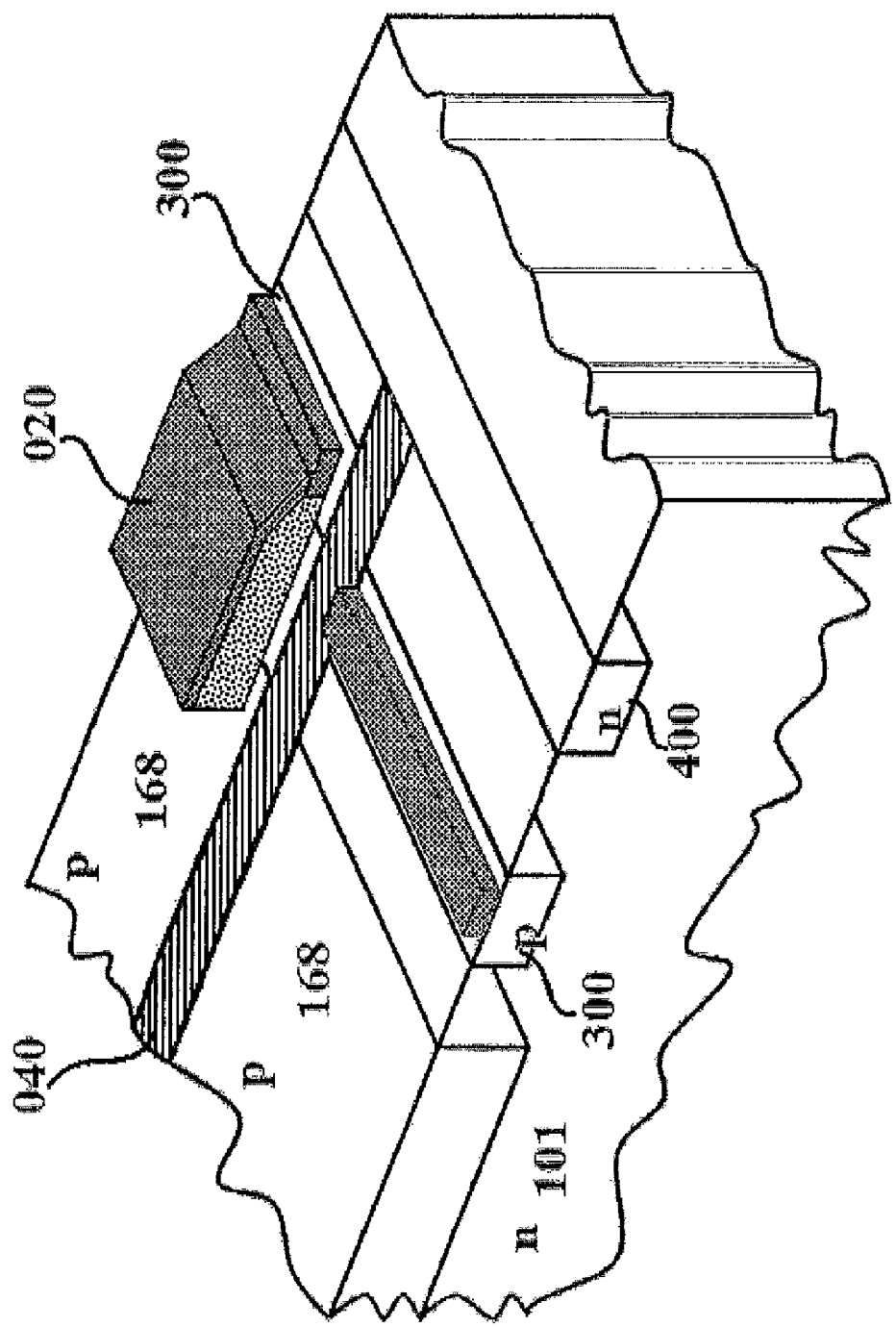
FIG. 9 is a solid diagram viewed from top but not vertically of the structure combining the structures shown in FIG. 7 and FIG. 8.

Although the structure shown in FIG. 8 can make the turn-on of the IGBT faster, yet it slows down the turning-off of the IGBT. This is due to that the gate-drain shorted p-MISFET, composed of p-region 168, p-region 300 and the electrode 020, is in the turn-off state when the IGBT is in the turning-off stage, so that the gate F cannot be charged fast enough to a value demanded. In order to solve this problem, the structures shown in FIG. 7 and FIG. 8 are combined together, i.e., implement them in different regions of the surface of the substrate, and make an isolation region 040 between them, wherein the isolation region can be implemented according to the method in Ref. [5]. An example is shown in FIG. 9, which is a solid figure viewed from top but not vertically of the cell of a device. When the IGBT is turned off, a voltage is induced fast enough by the p-region 300 on the part in the lower left side of the isolation region 040, p-region 300 has then no connection to the electrode 020, thus controlling the turn-on of p-MISFETs 900 in the low-voltage circuit region 200. When the IGBT is turned on, the charging (or discharging) of the gate electrode F can be achieved fast enough through the gate-drain shorted p-MISFET, which is on the part in the upper right of the isolation region 040 and composed of p-region 168, p-region 300 and the electrode 020. Thus, the p-MISFETs 900 in the low-voltage circuit region can be turned off rapidly, to ensure a strong conductivity modulation in n"-substrate region 101. A fast switching of an IGBT can therefore be realized.

In passing, in the method of implementing the low-voltage power supply shown as the p-region 300 in FIG. 7, the surface voltage-sustaining region with the p-region 300 at one end can also be isolated with other surface voltage-sustaining regions without any p-region 300.

Figure 10:
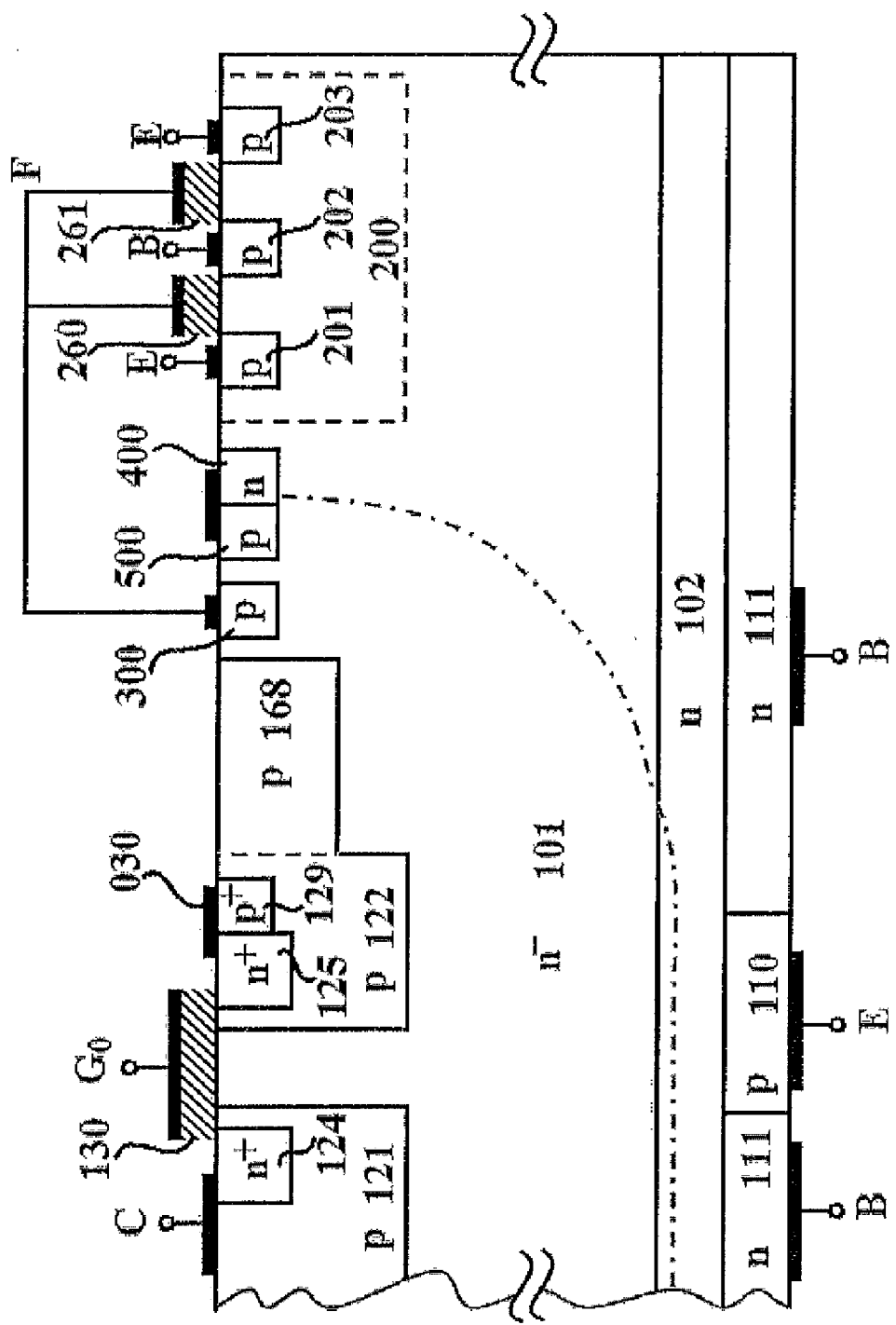
FIG. 10 is a schematic diagram of another improved method based on the one shown in FIG. 7.

In the turning-on process of the IGBT of the structure shown in FIG. 7, the charging and discharging of gate capacitor of p-MISFETs 900 in low-voltage circuit region 200 can only be achieved by using the surface voltage-sustaining region, which has a high resistance due to the long path of hole current, and therefore decreases the turn-on speed. In order to solve this problem, another method to improve the turn-on speed of an IGBT is proposed as shown in FIG. 10. Compared with FIG. 7, there is a p-region 500 next to the n-field-stop region 400, and the n-region 400 and p-region 500 are shorted through an electrode. The turn-off process of the IGBT shown in this figure is similar to that of the IGBT shown in FIG. 7. During the turning-on of the IGBT, holes are introduced into p-region 300 through p-region 500, and thus makes the gate voltage of p-MISFETs 900 in low-voltage circuit region 200 increase to nearly the voltage of the substrate 200. The process can be very fast and thereby the fast turn-on and turn-off of the IGBT can be realized. However, as the voltage across the electrode connected with p-region 500 and the collector C is at maximum, there would be a certain amount of leakage current flowing from p-region 500 to the collector C through the substrate region n⁻-region 101.

Figure 11:
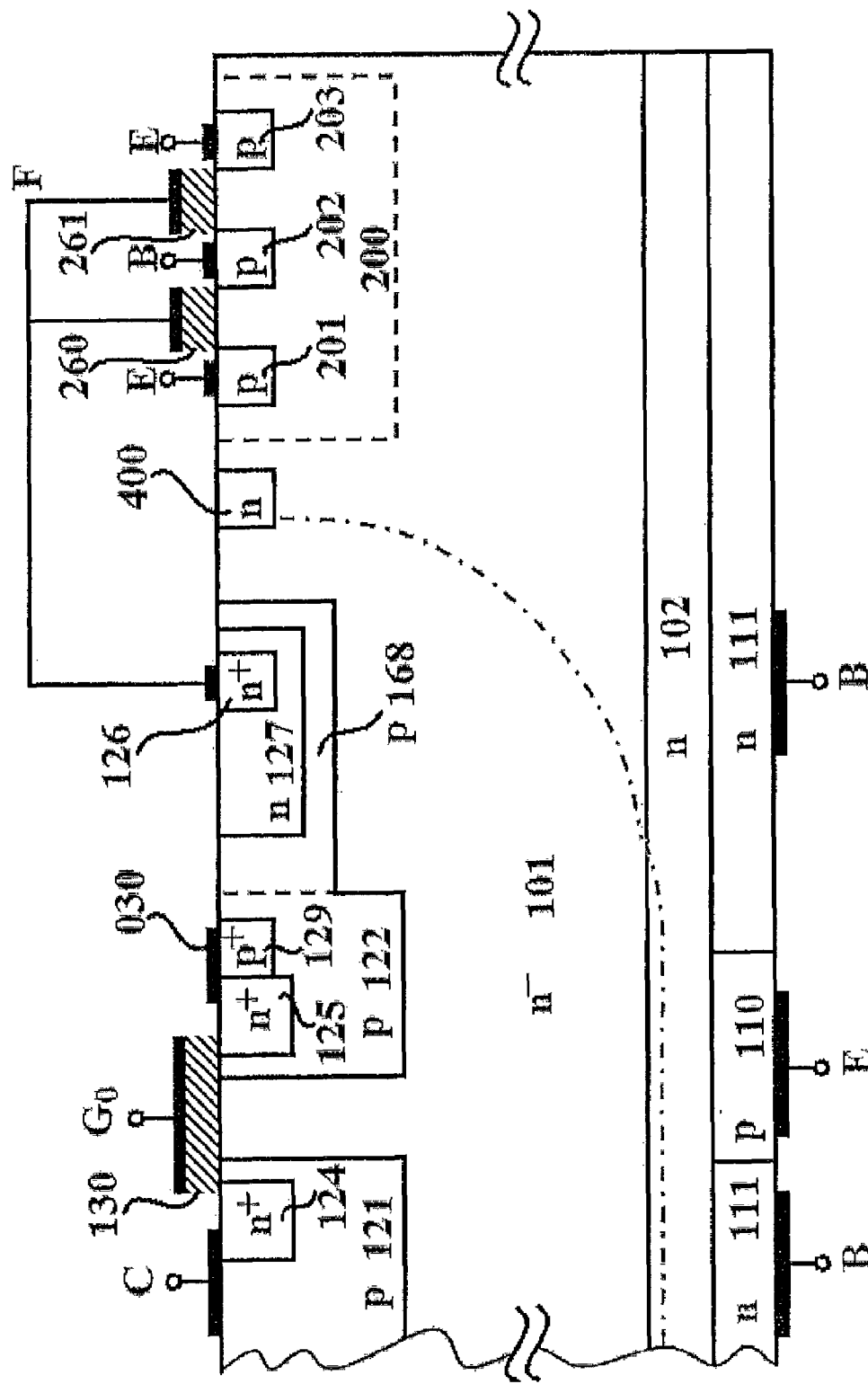
FIG. 11 is a schematic diagram of another method by using the surface voltage-sustaining region to induce a control voltage which is close to the potential of the neutral region in 200.

FIG. 11 shows another method to produce a control voltage to electrode F. This voltage comes from an n⁺-region 126 set in p-region 168. When the IGBT is turned on, the gate capacitor of p-MISFETs 900 in 200 can be charged (discharged) through the forward conduction of the p-n junction which is composed of p-region 168 and n⁺-region 126, thus the IGBT can be turned on fast enough. When the IGBT is turned off, a potential close to and slightly lower than the potential of terminal E can be induced in n⁺-region 126 through the depletion of p-region 168. The p-MISFETs 900 can be turned on by this potential, then the emitter and base are in short circuit connection, which makes the injection efficiency of the emitter of the IGBT be reduced significantly, thus, the current tail can be eliminated. In order to obtain a higher switching speed, a slightly larger area n-region 127 can be made around n⁺-region 126, so the current which charges and discharges the gate capacitor of p-MISFETs 900 in 200 is mainly a displacement current which charges and discharges the capacitor of the p-n junction formed by n-region 127 and p-region 168. Thus the switching speed of p-MISFETs 900 in 200 can be greatly increased, and then the switching speed of the IGBT can be greatly increased.

Figure 12:
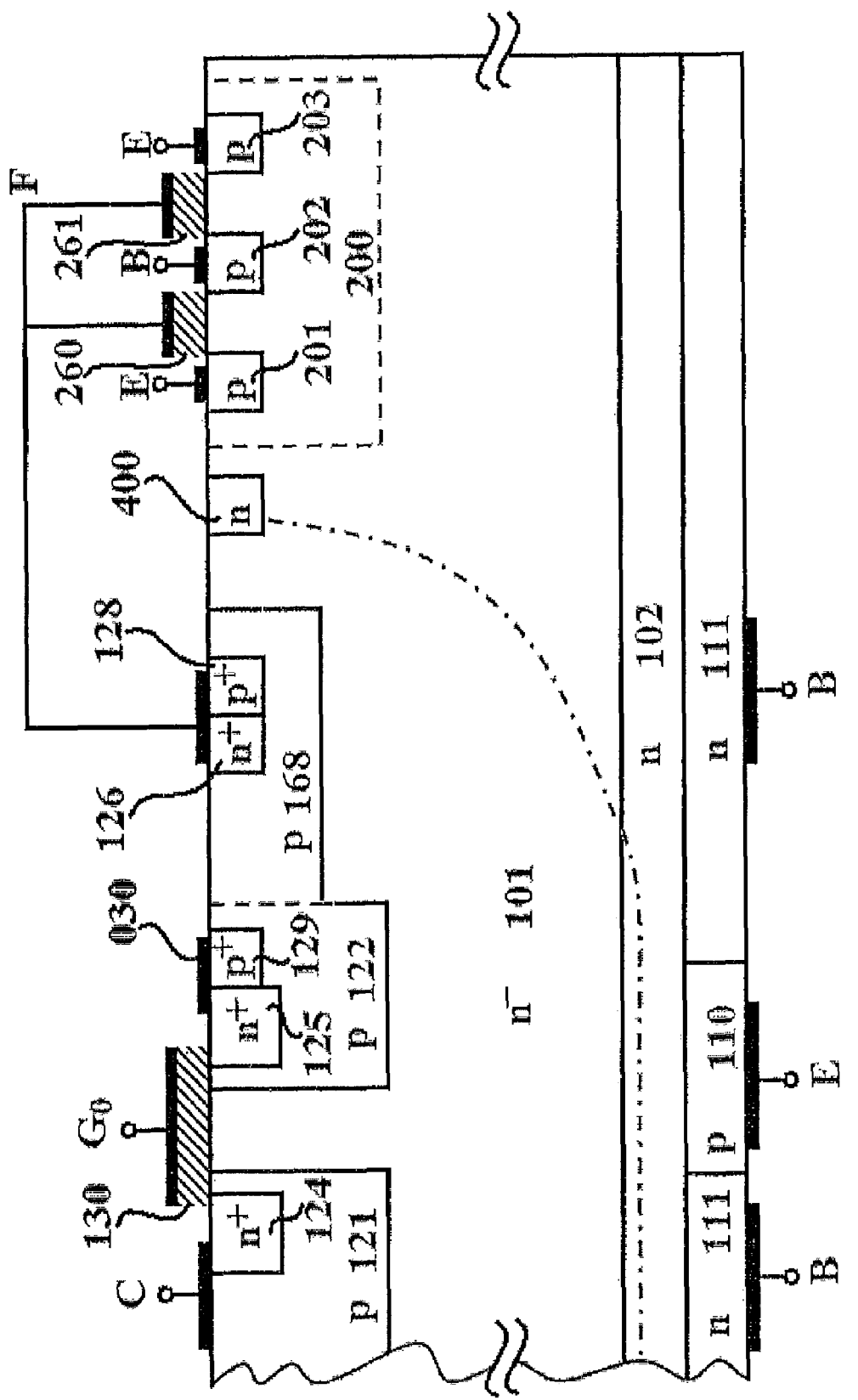
FIG. 12 is a schematic diagram of still another specific implementation method by using the surface voltage-sustaining region to induce a control voltage which is close to the potential of the neutral region in 200.

FIG. 12 shows another structure to obtain the fast switching of an IGBT. The difference of this figure to FIG. 11 is that there is a p⁺-region 128 next to n⁺-region 126 made inside p-region 168 and they are short circuited through an electrode. During the transient process of the turn-off of the IGBT, n⁺-region 126 can induce a voltage which is negative but close to that of terminal E. A rapid change of the potential of electrode F can be achieved through the current path from p⁺-region 128 to the electrode C through p-region 168. During the transient process of the turn-on of the IGBT, the gate capacitor of p-MISFETs 900 in 200 can be charged (or discharged) through the forward conduction of the p-n junction made by p-region 168 and n⁺-region 126. Therefore, the fast turn-on of the IGBT can be realized.

Figure 13:
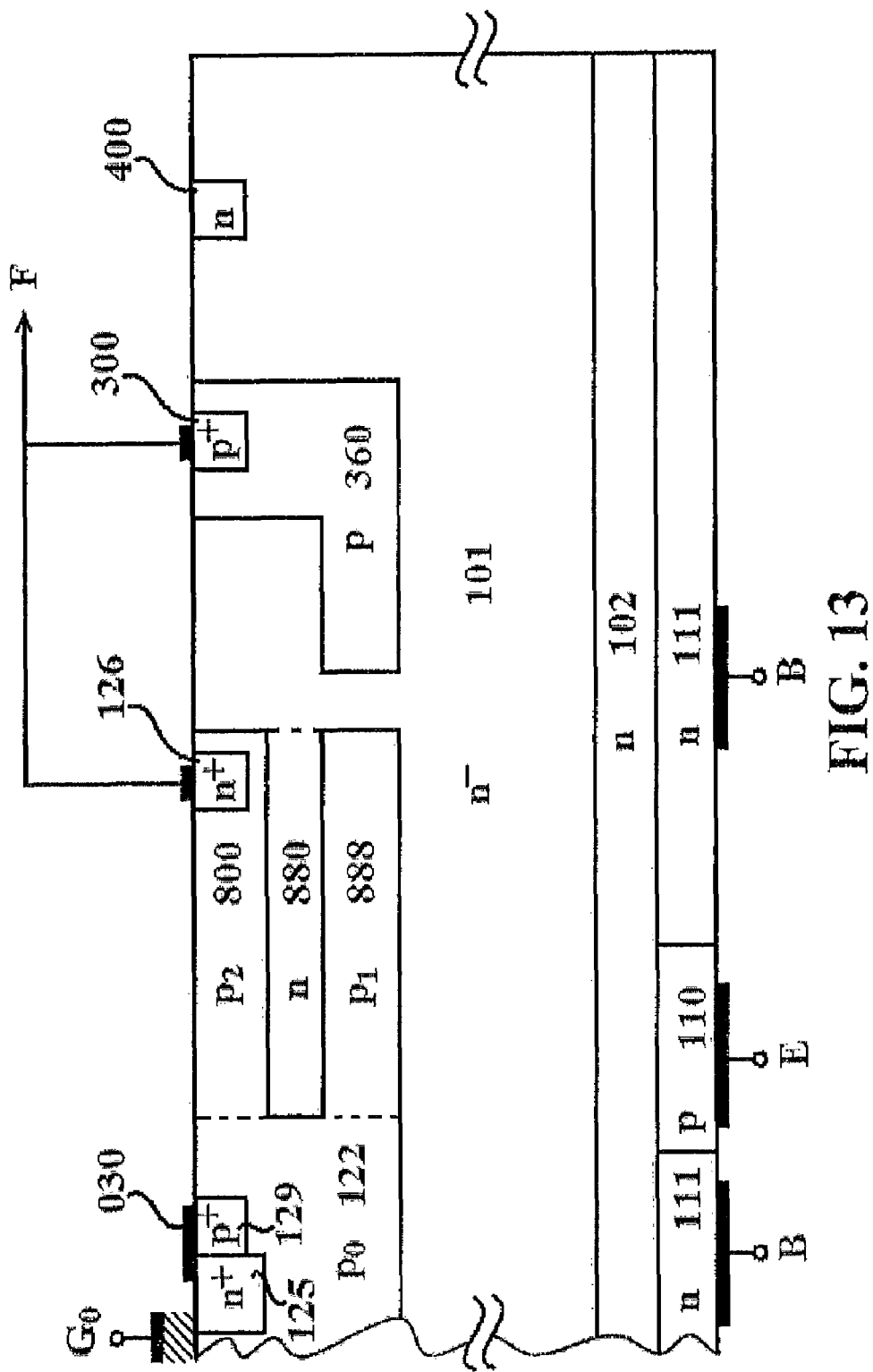
FIG. 13 is a schematic diagram of still another specific implementation method by using the surface voltage-sustaining region to induce a control voltage which is close to the potential of the neutral region in 200.

FIG. 13 shows another method to induce a control voltage close to that of terminal E through surface voltage-sustaining region. As shown in the figure, the surface voltage-sustaining region is composed of $p_1$-region 888, n-region 880 and $p_2$-region 800. Similar to the description of the FIG. 11, during the transient process of the turn-on of the IGBT shown in the FIG. 13, the gate capacitor of p-MISFETs 900 in the low-voltage circuit region 200 (200 is in the right region of the IGBT but not shown in this figure and the following FIGS. 16, 17, 19, 21, 22 and 24) can be charged (or discharged) through n⁺-region 126 and $p_2$-region 800, which enables the IGBT to be turned into the conductivity modulation state fast enough. During the starting stage of the turning-off of the IGBT, a potential close to the neutral region can be induced through p-region 360 which is near $p_1$-region 888. As both of p-region 300 in p-region 360 and n⁺-region 126 are connected with the gate electrode F of p-MISFETs 900, the control of turn-on of the p-MISFETs 900 can be achieved.

All of the structures shown in FIGS. 7-13 can realize a fast turn-off of an IGBT, but they are at the expense of decreasing the turn-on speed to varying degrees, wherein the main reason is that the charge (or discharge) of the gate capacitor of p-MISFETs 900 in the low-voltage circuit region 200 can not start until the potential of terminal E decreases to close to that of terminal C during the turning-on of the IGBT. In the above process, p-MISFETs 900 are always in the conduction state, which makes the non-equilibrium carriers can not be injected from the emitter of the IGBT into n⁻-base region 101 to achieve conductivity modulation, thus increasing the rise time $t_{on}$. Furthermore, if the IGBT has a small resistance as its load, then, at the moment of the turn-on of the IGBT, the electron current flowing from collector C through n-MISFET channel to n⁻-base region 101 reaches the electrode B, which in turn through the outer connection flows to the source electrode(s) of p-MISFETs 900 in region 200 and then flows out of the drain electrode(s) of p-MISFETs 900, and eventually flows to electrode E as demonstrated before in description of FIGS. 7-13. Therefore, there is a bypass of the emitter junction of the IGBT. As a result, there is only a small electron current through the small load resistance and produces only a small voltage drop on the load, whereas a large external applied voltage is dropped on the IGBT itself. In other words, the value of $V_{EC}$ is very large at this moment. On the other hand, the condition for conductivity modulation of an IGBT is the p-MISFETs 900 in the low-voltage region 200 to be turned off, i.e., $V_{EC}$ is very small. Evidently, a fast turn-on cannot be realized.

Figure 14:
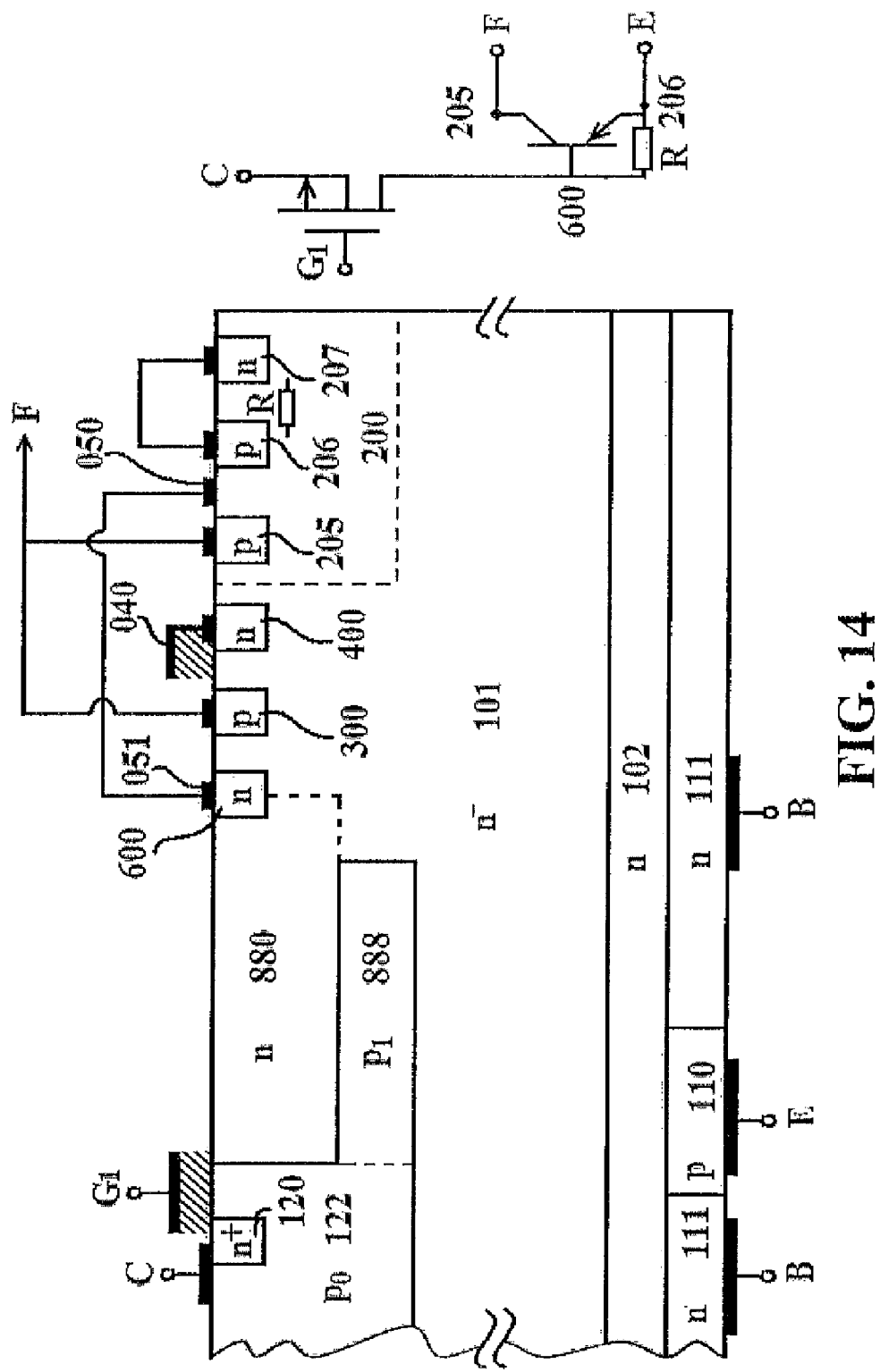
FIG. 14 schematically shows a specific structure which uses a bipolar transistor for assisting to charge (or to discharge) the gate capacitor of p-MISFETs in low-voltage circuit region.
Figure 15:
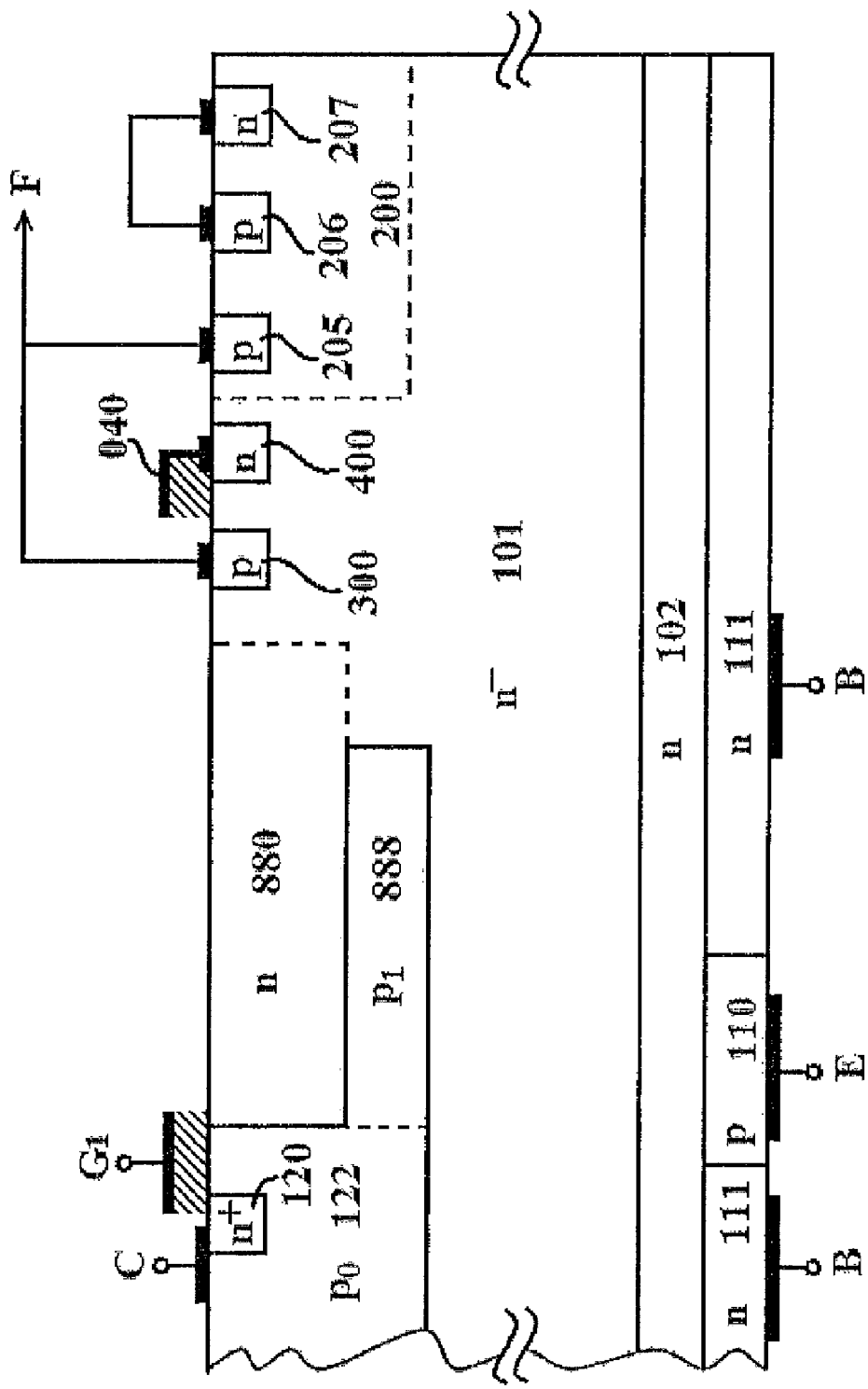
FIG. 15 schematically shows another specific structure which uses a bipolar transistor for assisting to charge (or to discharge) the gate capacitor of p-MISFETs in low-voltage circuit region.

In order to overcome the drawback stated above, a structure shown in the left part of FIG. 14 is proposed, which uses a bipolar device to assist the charge (or discharge) of the gate capacitor of p-MISFETs 900 in low-voltage region 200 (900 is not shown in this figure and in FIG. 15). In this figure, there is a pnp bipolar transistor in the low-voltage region 200, wherein p-region 205 serves as the collector region of the bipolar device, p-region 206 is the emitter region of the bipolar device, and the n-region beneath an electrode 050 is the base region. Note that p-region 205 is connected with floating p-region 300, having an electrode marked with F in the surface voltage-sustaining region of the IGBT, n-region 207 is short-connected with p-region 206, and electrode 050 is connected to electrode 051 which is in turn connected to an n-region 600 located in the surface voltage-sustaining region of the IGBT. Note also there is a body resistance between electrode 050 and n-region 207, so that the equivalent circuit is like the right part of FIG. 14 shown.

At the moment of the turning-on of the IGBT, the potential of terminal E is still high with respect to that of terminal C. At this moment, if a certain voltage is applied to the gate $G_1$ to make the n-MISFET turn on, the electrons flowing out of the electrode C and then through channel region underneath the gate $G_1$, via n-region 880, n-region 600 and then flow into n-region 207 through electrode 050 and then into the substrate in 200. As there is a parasitic resistance R with certain value between p-region 206 and n-region 207, there would be a certain voltage drop across n-region 207 and the n⁻-substrate nearby 206, i.e., there is a certain voltage drop across p-region 206 and the n-substrate nearby. When this voltage drop increases to about 0.7V, the holes will be injected from p-region 206 into substrate in 200, except a part of the holes recombines with electrons, the remaining part of holes will flow into p-region 205, whose voltage is negative with respect to p-region 206. That is to say, a current path is formed across p-region 205 and the substrate region in 200 underneath it. As p-region 205 is connected with the gate F of p-MISFETs 900, the bipolar device can be used to support the charge (or discharge) of the gate capacitor. The control voltage of $G_1$ can either be the same as that of the gate of the IGBT $G_0$, which makes the n-MISFET and the IGBT turned on at the same time, or be different from that of $G_0$. The threshold voltages of n-MISFET and the IGBT can also be different. It yields flexibility, e.g., the n-MISFET controlled by $G_1$ can be triggered to be in the conduction state before the IGBT is turned on, so p-MISFETs 900 in low-voltage region have already been turned off before the IGBT is turned on, and thereby a strong conductivity modulation can be formed fast enough in n-substrate 101. Also, the control voltage of $G_1$ can be independent of $G_0$. Since the technology of using low-voltage circuit to achieve such control is very common, it is no point to discuss it any further.

In FIG. 14, an n-region 600 is required underneath the electrode 051 to form ohmic contact and to guide the electrons to flow into region 200. However, n-region 600 almost acts like a field-stop region. It not only decreases the sustained voltage of surface voltage-sustaining region, but also makes the p-region 300 difficulty to be induced an enough voltage for controlling the gate F of p-MISFETs 900 in low-voltage region. To overcome this drawback, a structure shown in FIG. 15 is presented in this invention. In this structure, a bipolar device is used to assist the charge (or discharge) of the gate capacitance of p-MISFETs 900 and thereby the turn-on speed of the IGBT is improved. In comparison with the structure shown in FIG. 14, there is no n-region 600 in FIG. 15. Thus, when the n-MISFET controlled by gate $G_1$ is turned on, electrons will flow out of the electrode C and then through channel region underneath the gate $G_1$, via n-region 880, and n⁻-substrate region 101 underneath n-region 400, then flow into region 200, and eventually flow into n-region 207. Since there is a parasitic resistance R in the substrate region underneath p-region 206 and n-region 207, a voltage drop across the n-region between p-region 206 and the n⁻-substrate nearby is developed. When the voltage drop is raised up to about 0.7V, p-region 206 will inject holes into the substrate of 200, which has the same effect as what has been shown in FIG. 14. That is to say, it can be realized by using a bipolar device to assist the charge (or discharge) of gate capacitor of p-MISFETs 900 in low-voltage circuit region 200.

Figure 16:
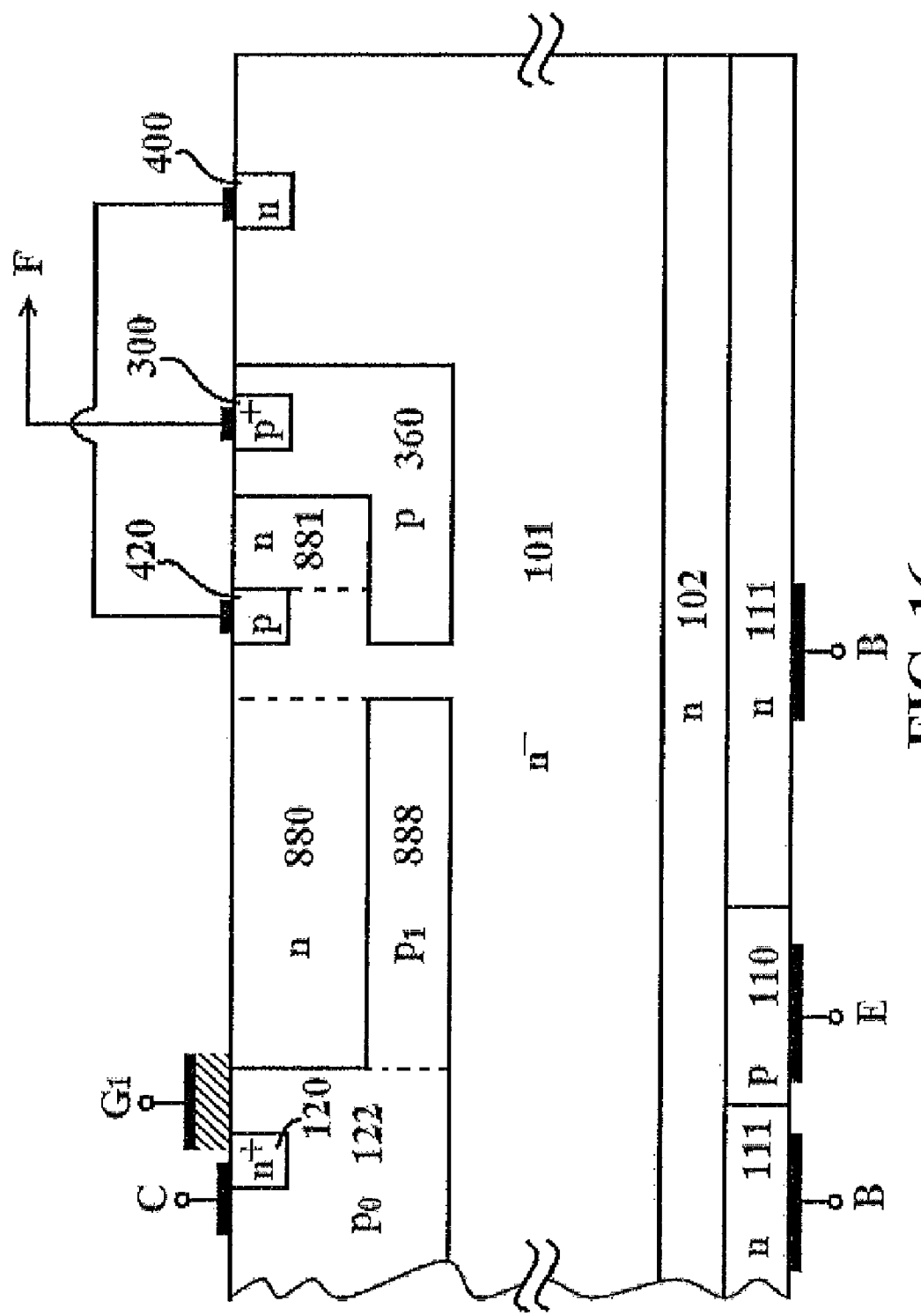
FIG. 16 schematically shows still another specific structure which uses a bipolar transistor for assisting to charge (or to discharge) the gate capacitor of p-MISFETs in low-voltage circuit region.

FIG. 16 shows another method of this invention. This method is to use a bipolar transistor to assist the charge (or discharge) of gate capacitor of p-MISFETs 900 to improve the turn-on speed of the IGBT. In this figure, p-region 420 is connected with n-field-stop region 400 through interconnection. At the moment of the turning-off of the IGBT, the potential induced on p-region 360 is close to that of terminal E, the p⁺-region 300 is then used to control the turn-on of the p-MISFETs 900 in low-voltage region 200. When the IGBT is being turned on, there is a negative voltage in p-region 300 relative to p-region 420. If the n-MISFET controlled by $G_1$ is turned on at this moment, the electrons flow from electrode C, through channel region, n-region 880 and enter into p-region 420. Since p-region 420 is connected to n-region 400 through an interconnection, the p-n junction formed by p-region 420 and n-region 881 is now forward biased. The bipolar transistor, which is composed of p-region 420, n-region 881 and p-region 300 is now in conduction state, and a current path between the gate F of p-MISFETs 900 and n⁻-substrate 101 is therefore established, and the charge (discharge) of gate capacitor is improved. Besides, there is an important feature of the structure: due to that the potentials of p-region 420 and n-region 400 are the same, but they are located at two sides of p-region 300, the induced voltage of p-region 300 relative to terminal E is clamped, so that the voltage of the gate F of p-MISFETs 900 relative to the substrate-region in 200 can be limited to be not too large.

Figure 17:
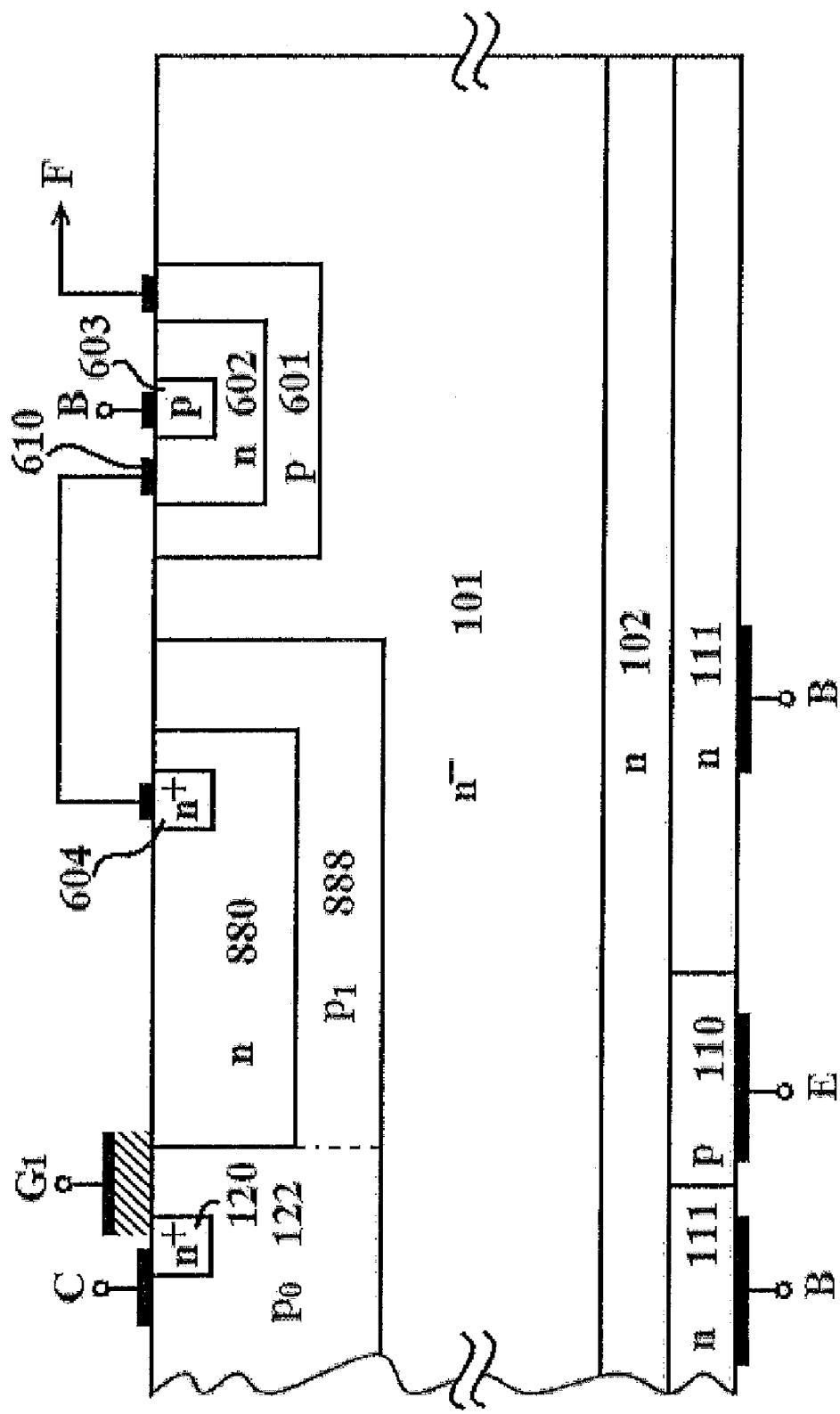
FIG. 17 shows a schematic diagram of the structure based on the one shown in FIG. 7 for assisting to charge (or to discharge) the gate capacitor of p-MISFETs in low-voltage circuit region.
Figure 18:
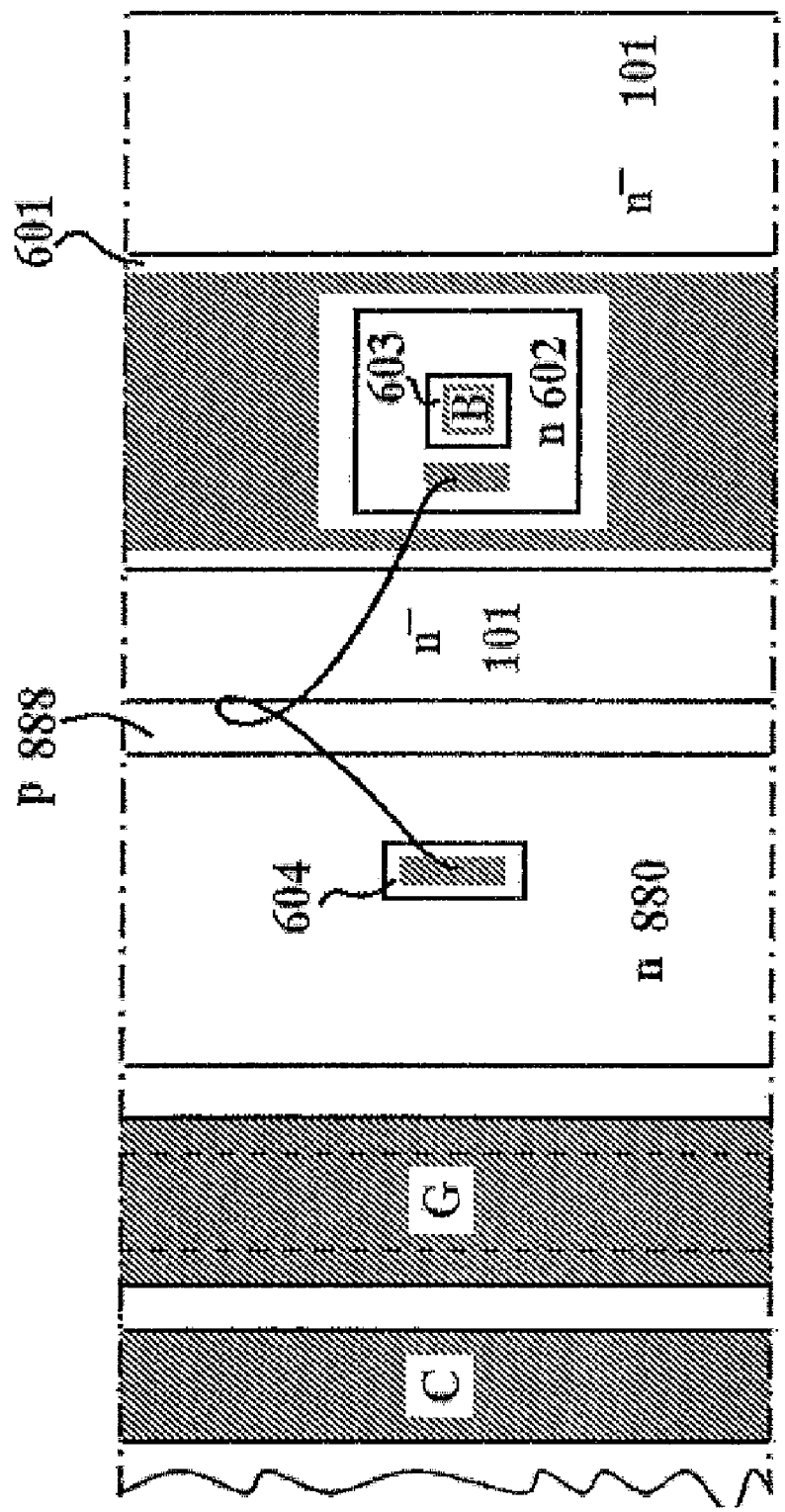
FIG. 18 shows a schematic top-view of the structure shown in FIG. 17.

FIG. 17 shows another implementation method to improve the turn-on speed of the IGBT. The method is to use a bipolar transistor to assist the charge (or discharge) of gate capacitor in order to improve the turn-on speed of the IGBT. The bipolar transistor composed of p-region 601 as its emitter region, n-region 602 as its base region and p-region 603 as its collector region. The emitter is connected to the gate F of p-MISFETs 900 in low-voltage region 200. The collector is connected to the electrode B through an outer connection. The base has an electrode 610 and through which connected to an n⁺-region 604 set in the n-region 880 of the surface voltage-sustaining region. When the n-MISFET controlled by $G_1$ is turned on, the electrons flow from electrode C, through the channel of n-MISFET to n-region 880, and eventually flow to base region 602 of the bipolar transistor. Enough current can be produced to F. FIG. 17 can be realized based on FIG. 7, and a top view of the upper surface of the substrate of the structure shown in FIG. 17 is shown in FIG. 18.

Figure 19:
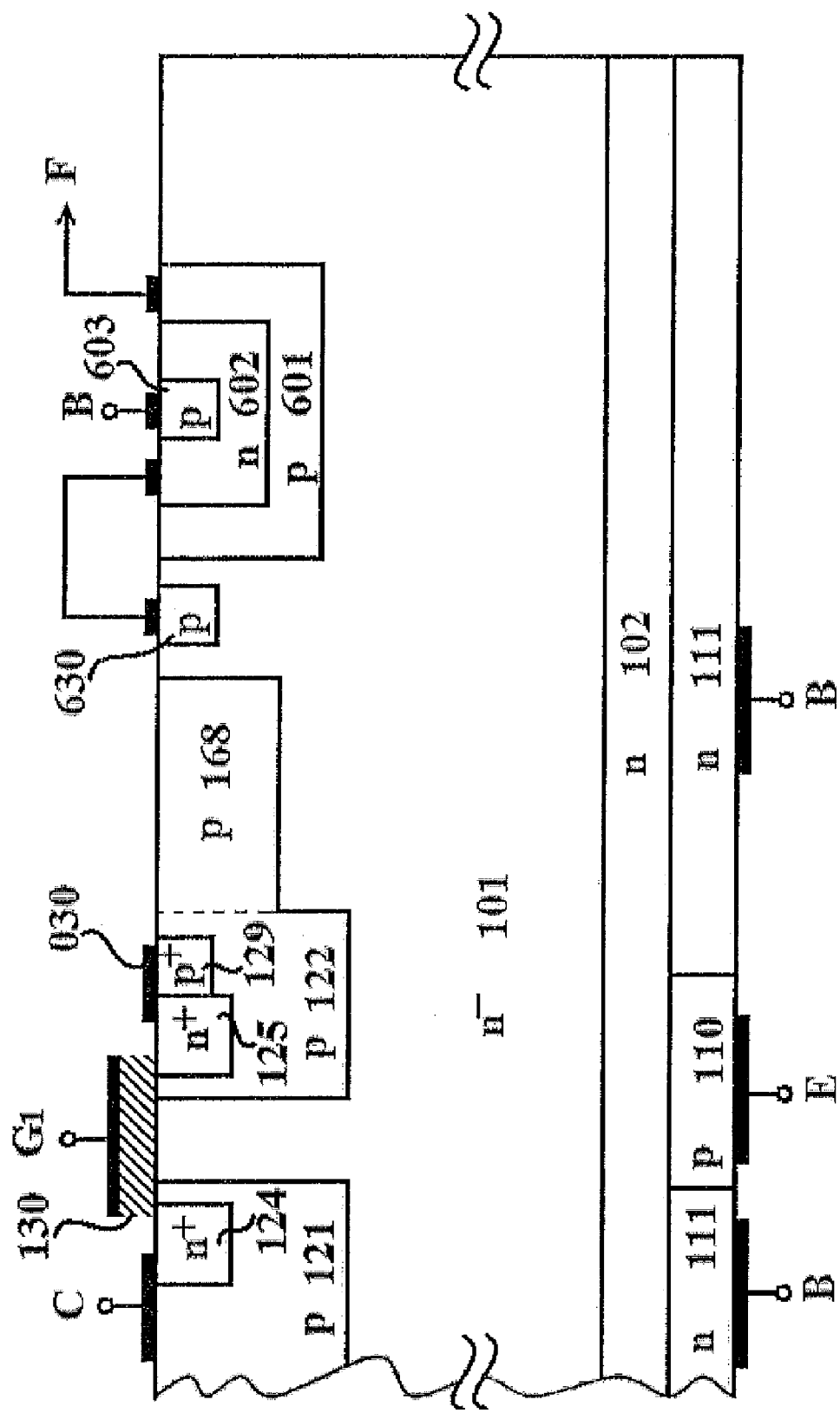
FIG. 19 shows a schematic diagram of another structure based on the one shown in FIG. 7 for assisting to charge (or to discharge) the gate capacitor of p-MISFETs in low-voltage circuit region through a bipolar transistor.

FIG. 19 shows another method for substituting FIG. 17. Compared with the structure shown in FIG. 17, the structure shown in FIG. 19 has another kind of surface voltage-sustaining region, and the technology of it is simpler. In this figure, $G_1$ controls a p-MISFET. The principle of the operation of the fast switching of the IGBT is similar to what is shown in FIG. 17. It is noted that when the voltage applied to $G_1$ reaches a certain value to form an inversion layer in the n-region 101 underneath the gate, the holes will flow across p-region 121 and p-region 122; when the voltage applied to $G_1$ reaches a certain value to form an inversion layer in the p-regions 121 and 122 underneath the gate respectively, the electrons will flow from $n^+$-region 124 and $n^+$-region 125 to base region, respectively.

In the above, many methods for making the p-region 300 (see FIGS. 7, 8, 10, 13, 14, 15 and 16) charge (or discharge) fast enough when the IGBT is turned on have been proposed. Actually, the turn-off time of the IGBT may be long enough in practical application, and the requirement is only that there is no injection of minority carriers within the initial time of the turning-off process. It is obvious that a large resistance can be set in series with p-region 300 on one side and neutral base region on the other side. Roughly speaking, if the capacitance between p-region 300 and neutral base region is $C_1$ (which contains the capacitance between electrode F and the ground), and the parallel resistance is $R_1$, then the discharge time is about $C_1 R_1$. As long as $C_1 R_1$ is so large that no more minority carriers are injected, and is so small that the turn-off time of the IGBT is longer than it, then the measures to speed up the turn-on behavior described above are not necessary.

The salient feature of the present invention is using variation lateral doping surface region to implement the surface voltage-sustaining region. It should be noted that if a field limiting ring is used as surface voltage-sustaining region, the following problems will be encountered. Suppose that the voltage which controls low-voltage circuit in region 200 is from a ring, when $V_{EC}$ is small, the field limiting ring may be not in the range of depletion region. And when $V_{EC}$ is large, the voltage of the field limiting region may be overlarge. Therefore, when the value of $V_{ac}$ varies within a large range, it is difficult for the IGBT to achieve a fast turn-off behavior.

Figure 20:
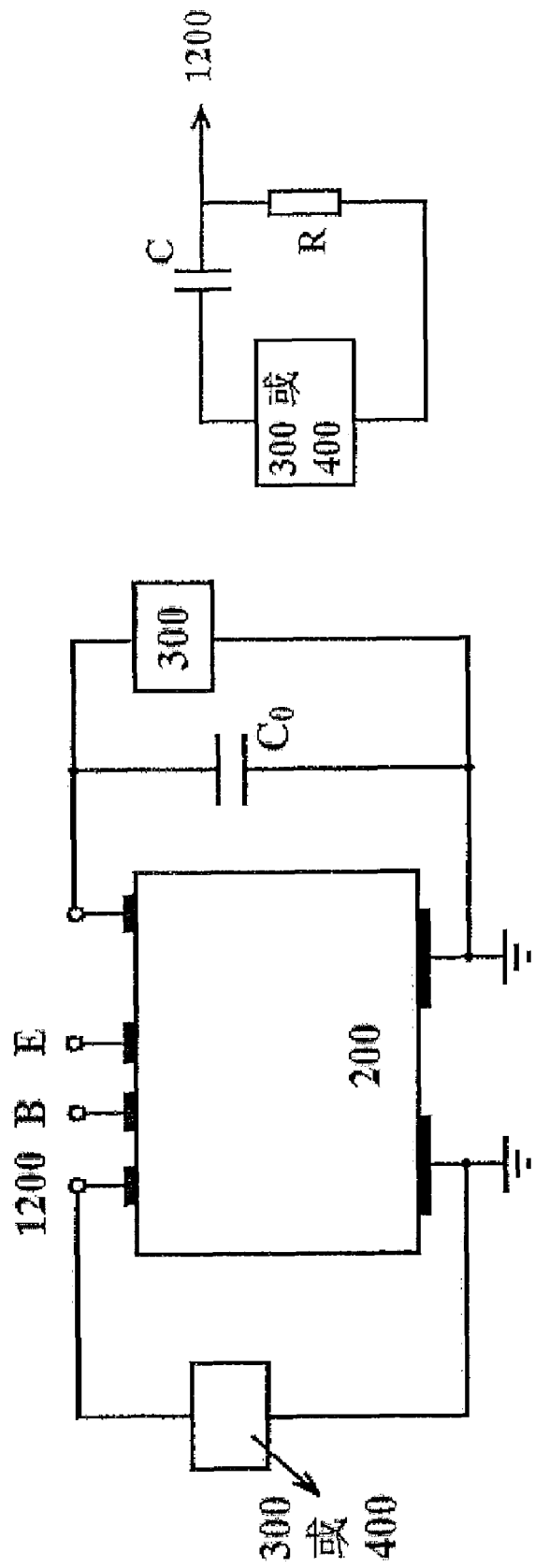
FIG. 20 shows a schematic diagram about the function of the low-voltage circuit in present invention (the figure shown on the right schematic shows a simple example of using the edge of voltage change to obtain the control voltage).

The present invention makes use of the change of emitter-collector voltage of the bipolar transistor in an IGBT, or the change of gate-source voltage of p-MISFETs 900, to control the voltage drop across output terminals E and B of the low-voltage circuit in neutral region outside the edge of depletion region. To a certain extent, the function of the low-voltage circuit of the present invention can be described by using the left part of FIG. 20. Wherein the low-voltage circuit region 200 has not only the emitter E and base B on the upper surface and two ground terminals with respect to the neutral base region, but also other two terminals: one of them is the control terminal 1200, the other is connected to the power supply. The power supply can be realized by using a p-region 300 at junction terminal. In order to maintain the stability of the power supply, an external capacitor $C_0$ can also be added. The voltage of control terminal 1200 of the low-voltage circuit can be obtained by region 300 and/or region 400. Actually, the signal at the edge of voltage change in region 300 and/or region 400 can also be adopted. A simple example is shown on the right part of FIG. 20: the change of voltage of region 300 or region 400 can cause the changes of magnitude and direction of the current of resistor R, thus a pulse can be obtained, wherein the capacitor C plays a role of DC-blocking capacitor. The pulse can be used as an input of control terminal of the low-voltage circuit, and then the output voltage can be changed by using the corresponding processing and drive circuit. In passing, there are various well-known technologies of the implementation of the low-voltage circuit, which even include the method to implement a p-well in region 200 to get an n-type device.

Figure 21:
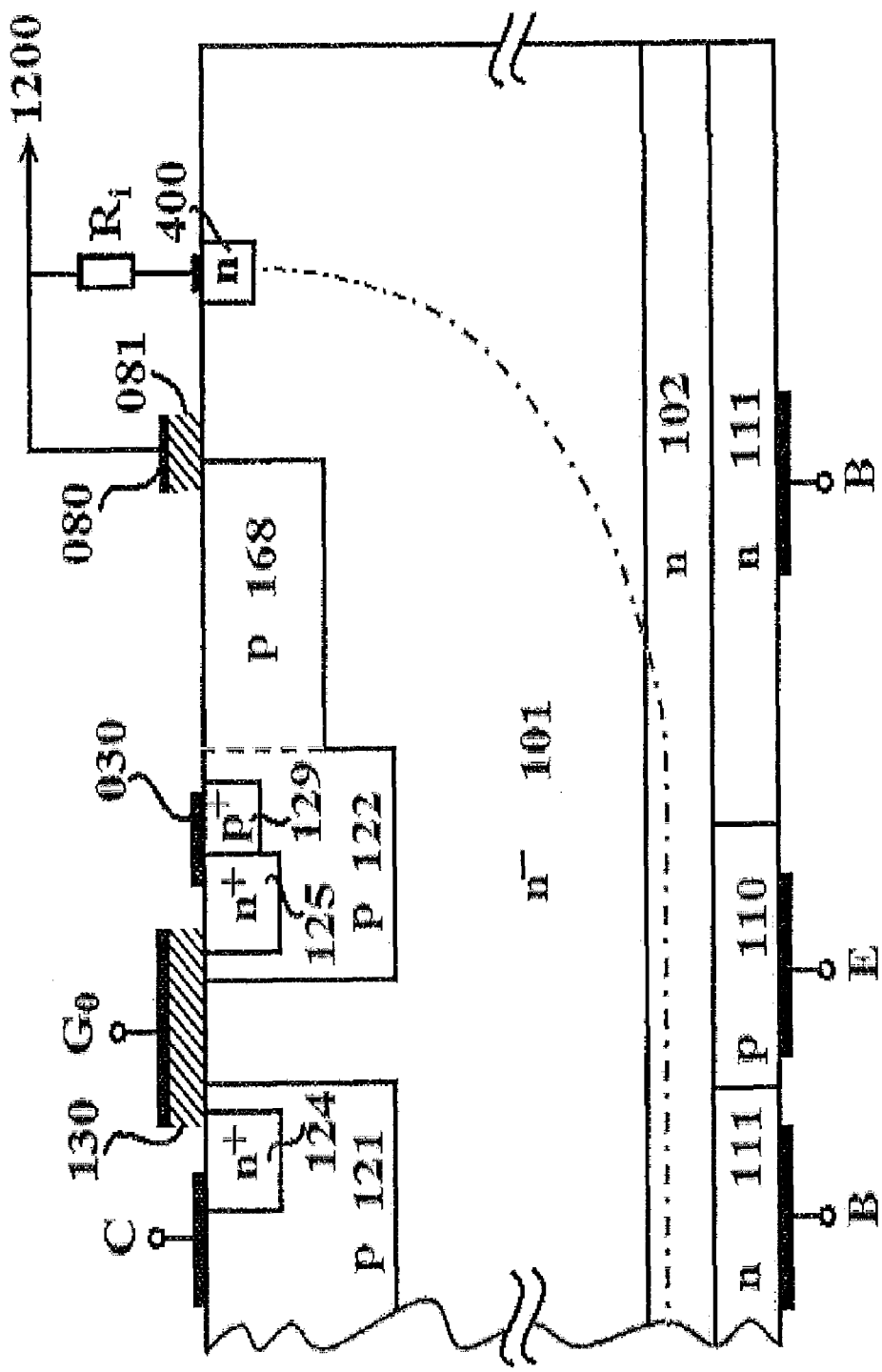
FIG. 21 schematically shows a method by connecting an insulator layer which covers on the end of the surface voltage-sustaining region with the neutral region through a resistor $R_i$ to obtain the control voltage.

An easiest way to get pulse is shown in FIG. 21. The end of the lateral p-region 168 is covered with an insulator layer 081, which is in turn covered by a gate 080, and the gate is connected to neutral base region 400 through a resistance $R_i$. A pulse for sending to 1200 can be obtained from gate 080. The pulse is a negative one with respect to neutral base region when the negative voltage drop across p-region 122 and neutral base region increases. The pulse is a positive one with respect to neutral base region when the negative voltage drop across p-region 122 and neutral base region decreases. The pulse can be used to trigger one kind of low-voltage circuit.

Obviously, two gates of such kind can be set to get pulses, and to control the output terminals of the low-voltage circuit as two input terminals of a RS trigger. Besides, the same effect can be obtained when the region 300 shown in FIG. 7 is connected to the neutral base region 400 through a resistance $R_i$.

Figure 22:
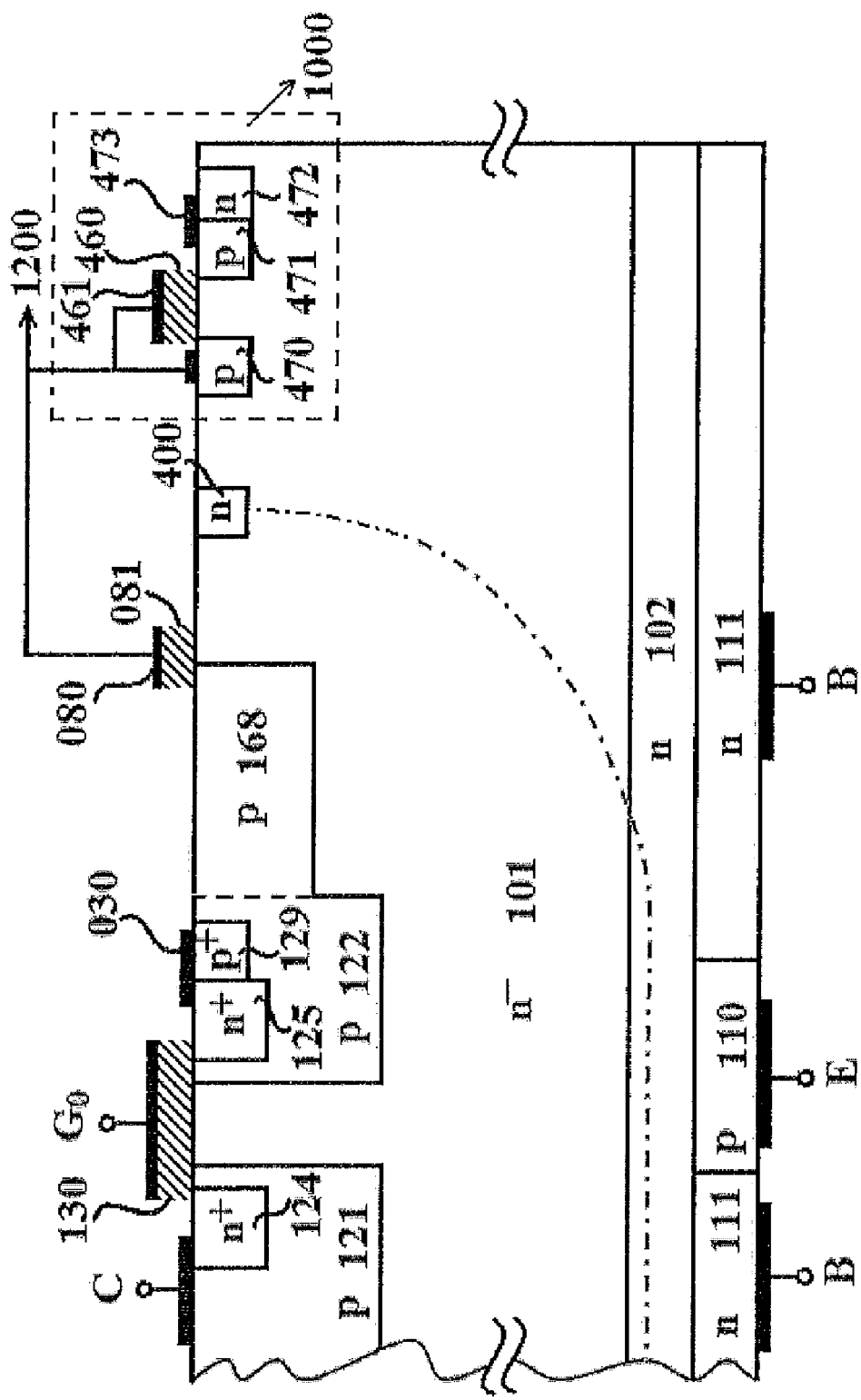
FIG. 22 shows a schematic diagram of structure by using a p-MOST with gate-drain shorted to realize the resistor $R_i$ shown in FIG. 21.
Figure 23:
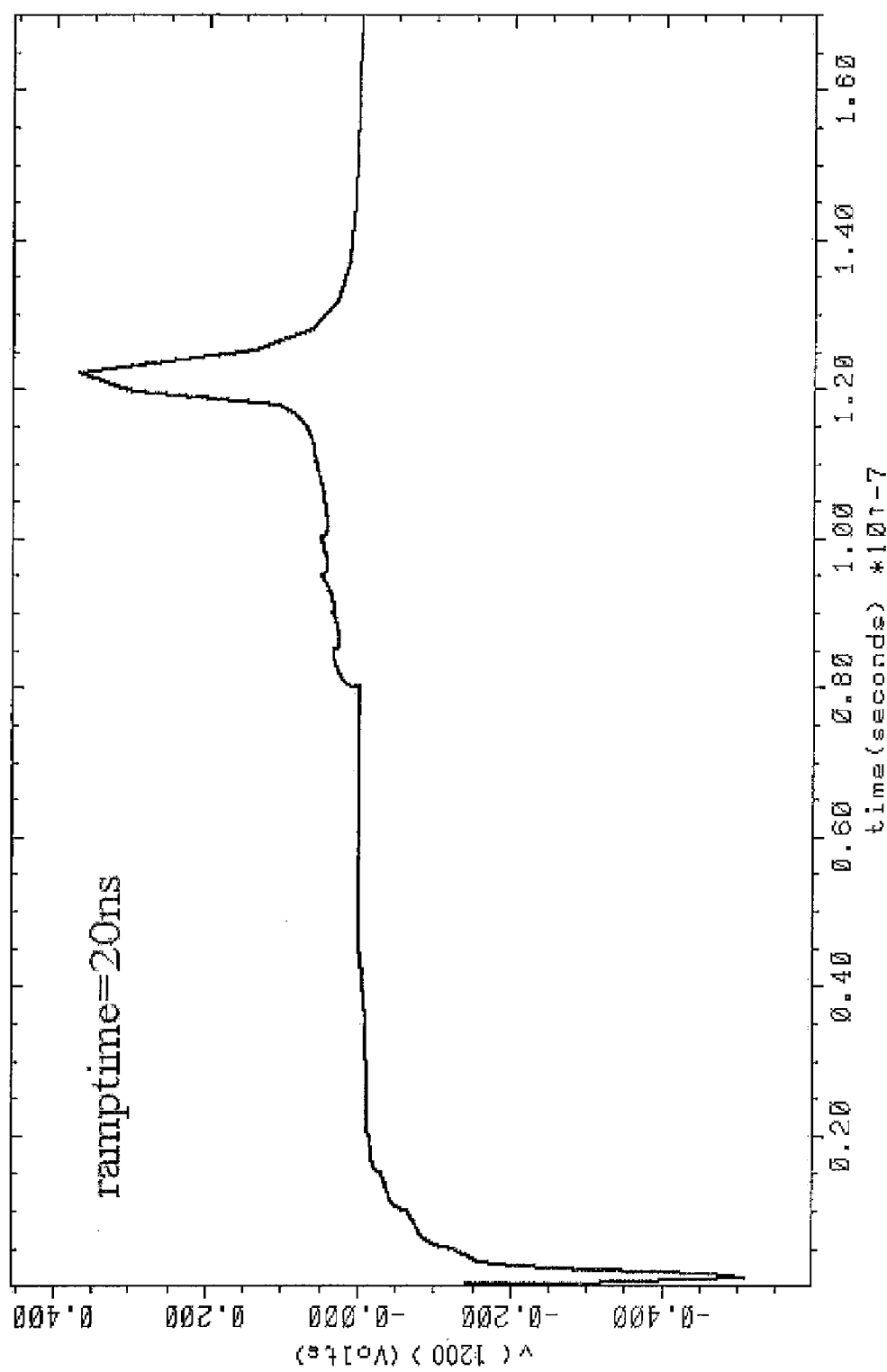
FIG. 23 schematically shows the positive and negative pulses versus time obtained by the structure shown in FIG. 22.

Of course, there are varieties of methods to realize the resistance $R_i$; in FIG. 21. FIG. 22 shows an example for realizing an active resistance $R_i$, i.e., by using a gate-drain shorted p-MISFET 1000. The p-region 470 and p-region 471 are the drain region and source region of the p-MISFET 1000, respectively. p-region 471 is connected with neutral base region 472 through the electrode 473. The shaded area 460 stands for the gate oxide or gate insulator, which covers a part of p-region 470, a part of p-region 471 and n-region 101 between them, and electrode 461 is the gate electrode of p-MISFET 1000. Electrode 461 is connected with the drain electrode of p-MISFET 1000, and both of them are connected to gate 080. A pulse for sending to 1200 can be obtained from gate 080. The pulse is a negative one with respect to neutral base region when the negative voltage drop across p-region 122 and neutral base region increases. The pulse is a positive one with respect to neutral base region when the negative voltage drop across p-region 122 and neutral base region decreases. FIG. 23 shows the positive and negative pulses obtained by the structure shown in FIG. 22 versus time, and this result is simulated by using the TMA-MEDICI device simulation software. Here the thickness of the gate oxide 460 is 50 nm, the gate length is 2 um, the concentration of n-substrate 101 is $2 \cdot 10^{14}$ cm$^{-3}$, and the rise time and fall time of the voltage of region 030 are both 20 ns.

Figure 24:
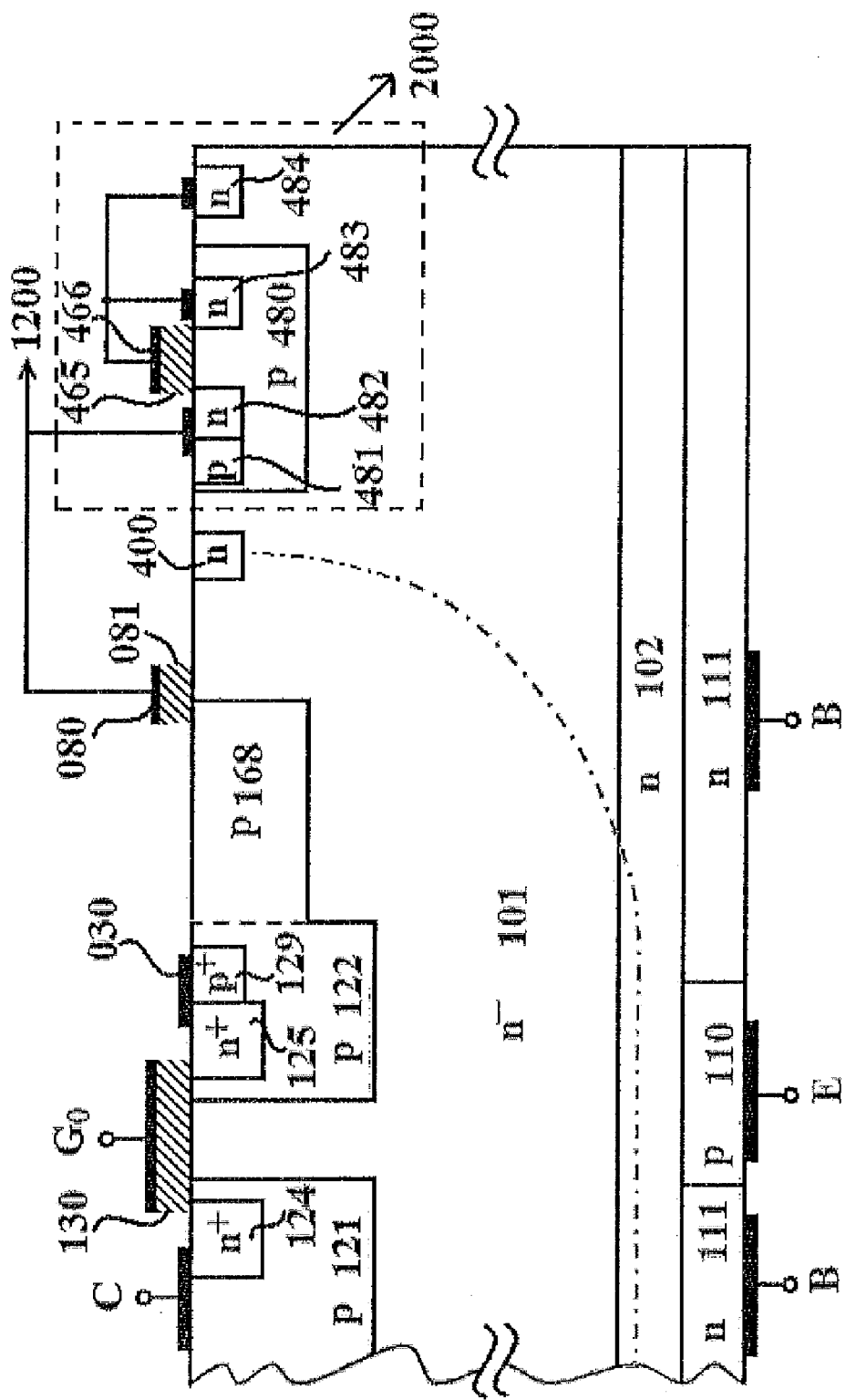
FIG. 24 shows a schematic diagram of structure by using an n-MOST with gate-drain shorted to realize the resistor $R_i$ shown in FIG. 21.
Figure 25:
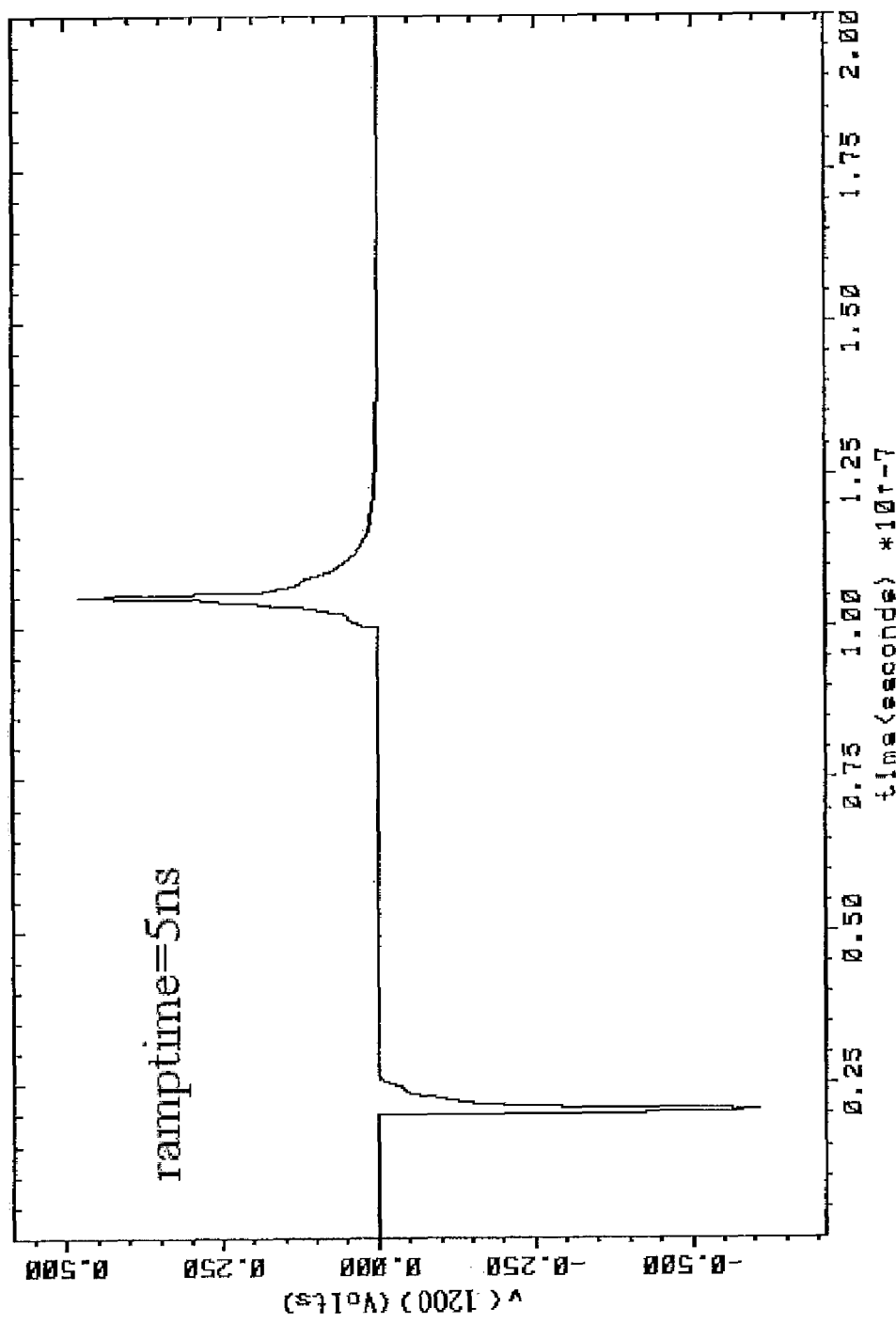
FIG. 25 schematically shows the positive and negative pulses versus time obtained by the structure shown in FIG. 24.

FIG. 24 shows an example for realizing an active resistance $R_i$, i.e., by using a gate-drain shorted n-MISFET 2000 to realize the resistor $R_i$. The n-MISFET 2000 is implemented inside a p-well 480. In this figure, n-region 483 and n-region 482 are drain region and source region of the n-MISFET 2000, respectively. n-region 482 is connected to the source-body region 480 through p-region 481. The gate electrode and drain electrode of the n-MISFET 2000 are in short circuit connection and both of them are connected with neutral base region 484 through electrode 466. The source electrode of n-MISFET 2000 is connected with the gate electrode 080, and the pulse which 1200 needed can be obtained from the gate 080. The process how the structure shown in FIG. 24 gets positive and negative pulses is similar to that in FIG. 22. FIG. 25 shows the positive and the negative pulses obtained by the structure shown in FIG. 24 versus time, and this result is simulated by using the TMA-MEDICI device simulation software. Here, the thickness of gate oxide 465 of the n-MIS- FET is 30 nm, the gate length is 2 um, the concentration of p-well (p-region 480) is $10^{15}$ cm$^{-3}$, and the voltage rise time and fall time of 030 are both 5 ns.

It should be noted that the parameters of the simulated devices are not optimized.

Finally, it should be noted that although the invention has been described and illustrated in detail with reference to specific embodiments, it is not intended that the invention be limited to these illustrative embodiments and the object of choosing and describing the examples of the application of the present invention is for better explanation of the theory and practical applications. Those skilled in the art will recognize that modifications and variations can be made without departing from the spirit of the invention. Therefore, it is intended that this invention encompass all such variations and modifications as fall within the scope of the appended claims.

The invention claimed is:

1. An IGBT made on a semiconductor substrate of a first conductivity type having two main surfaces, comprising at least a cell of a metal-insulator-semiconductor field effect transistor, MISFET, of first conductivity type and at least a cell of a bipolar junction transistor, BJT, of a second conductivity type, wherein said cell of MISFET of said first conductivity type has at least one cell of source-body region of semiconductor of second conductivity type underneath the first main surface and at least one source region of semiconductor of said first conductivity type in said source-body region, and a part of said source-body region and a part of said source region are connected by a conductor as a source electrode of said MISFET; an insulator layer covering on the surface of a part of said source region, a part of said source-body region and a part of said substrate, and a conductor covering on said insulator layer as the gate electrode of said MISFET;

said cell of BJT of said second conductivity type has a base region in said substrate, at least one emitter region being a semiconductor region of second conductivity type in the second main surface and at least one collector region; wherein said emitter region is adjacent at least a base region, both said emitter region and said base region have their own electrodes as emitter and base on said second main surface, respectively, said collector region is said source-body region of said MISFET, a collector of BJT is said source electrode of said MISFET;

said IGBT has an edge termination region at first main surface separating entire source-body regions of said cell(s) of MISFET of said IGBT from a neutral base region, said neutral base region keeps neutral rather than depleted even under a maximum reverse bias voltage applied across said emitter and said collector;

at least a portion of said edge termination region has a section of largest voltage contacting directly to said source-body region of said MISFET, a section of transit region contacting directly to said section of largest voltage on the one end and contacting directly or through a field-stop region of a heavily doped semiconductor of first conductivity type to said neutral base region on the other end;

said section of transit region has at least a bottom layer of second conductivity type starting from said section of largest voltage to a place with a distance to said neutral base region, wherein said distance is smaller than a distance from said one end to said other end;

said voltage is with respect to said neutral base region, and said largest voltage is a negative value when said semiconductor of first conductivity type is n-type, said largest voltage is a positive value when said semiconductor of first conductivity type is p-type;

a low-voltage circuit region is located in said neutral base region;

said low-voltage circuit region has at least two semiconductor regions, each lead out an electrode as two output terminals of said low-voltage circuit region, and said two terminals are each connected to each said emitter and said base of the second main surface of said IGBT through outer connections;

said low-voltage circuit region has at least one electrode terminal as control terminal(s), and a voltage drop across two output terminals of said low-voltage circuit is controlled by applying a voltage across said control terminal (s) and said neutral base region.

2. An IGBT according to claim 1, wherein under a maximum reverse bias voltage being applied across said source-body region and said neutral base region, said section of transit region emits an effective electric flux density of the second conductivity type to said base region; said effective electric flux density gradually or step-wisely decreases from a value of close to a value of $qD_0$ to a value of close to zero according to a distance from said cell to said neutral base region along the surface; wherein q is the charge of an electron and $D_0$ is the density of depleted ionized impurities of second conductivity type of the heavily doped region of a one-sided abrupt parallel-plane junction made by the same base under its maximum reverse applied voltage;

said effective electric flux density of second conductivity type represents the total numbers of electric flux of ionized impurities in an area of the surface divided by said area; the dimension of said area in any direction along the surface is smaller than the depletion depth of the substrate of a one-sided abrupt parallel plane junction made by the same substrate under its maximum reverse applied voltage, but is larger than the thickness of said transit region.

3. An IGBT according to claim 1, wherein said section of largest voltage has two MISFET cells, both having the same structure of said MISFET cell of said IGBT;

wherein both source electrodes of a first MISFET cell and a second MISFET cell are contacted directly to their own source regions and source-body regions;

wherein said source electrode of said first MISFET cell is connected to said source-body region of said IGBT through inner connection; whereas said source electrode of said second MISFET cell is not connected to anything;

wherein both gate electrodes of said first MISFET cell and said second MISFET cell are contacted together and be applied by the same gate voltage of said IGBT or by other voltage.

4. An IGBT according to claim 1, wherein said section of transit region has at least two semiconductor layers of opposite conductivity types;

wherein said section of largest voltage has an active region of a lateral MISFET of first conductivity type; said lateral MISFET has a source-body region surrounding said cell(s) of said MISFET of said IGBT, said lateral MISFET has a source electrode connected through inner connection with the source electrode of said MISFET cell of said IGBT;

said lateral MISFET has a gate electrode being connected through inner connection with the gate electrode of the cell of said IGBT or being an independent electrode;

said lateral MISFET has a drift region being said layer(s) of said first conductivity type of said transit region.

5. An IGBT according to claim 1, wherein said section of transit region has at least one floating region, said floating region(s) is (are) a heavily doped region of semiconductor of second type and/or semiconductor of first type located near said neutral base region and underneath said first main surface;

said floating region(s) has(have) an undepleted region under a maximum reverse bias voltage applied across said source-body region and said neutral base region;

an electrode is covered on said floating region or covered on both said floating region in said transit region and an insulator layer on said first main surface wherein said electrode of said floating region is connected to said control terminal of said low-voltage circuit through an inner connection.

6. An IGBT according to claim 1, wherein said control terminal of said low-voltage circuit region is connected to said field-stop region.

7. An IGBT according to claim 1, wherein said control terminal of said low-voltage circuit region is connected to both said field-stop region and said floating region(s).

8. An IGBT according to claim 1, wherein said section of transit region has two floating regions: a first floating region of semiconductor of second conductivity type is located close to said neutral base region and a second floating region of semiconductor of second conductivity type or of semiconductor of first conductivity type is located between said first floating region and the remaining transit region;

wherein said first floating region has an electrode on its top, said electrode of said first floating region is connected to said control terminal through an inner connection; wherein inside said first floating region is a semiconductor region of first conductivity type and has an electrode on its top and connected thereby to said second floating region through an inner connection; wherein said first floating region has still another semiconductor region of second conductivity type inside said semiconductor region of first conductivity type and has an electrode on its top and connected thereby to said terminals connected to said base of said low-voltage circuit region.

9. An IGBT according to claim 1, wherein, an insulator layer covers on the first main surface in said section of transit region near said neutral base region, a conductor covers on said insulator layer and connected to said control terminal and also connected through a resistance to said field stop region;

wherein said resistance is a passive one or an active one formed by a device.

10. An IGBT according to claim 1, wherein said two output terminals of low-voltage circuit are a source electrode and a drain electrode of a low-voltage MISFET respectively and said control terminal is connected to a gate of said low-voltage MISFET.

11. An IGBT according to claim 1, wherein said two output terminals of low-voltage circuit are a emitter electrode and a collector electrode of a low voltage bipolar transistor respectively and said control terminal is connected to said neutral base region.

12. An IGBT according to claim 1, wherein a heavily doped region is in said section of transit region near said neutral base region, said heavily doped region is not fully depleted under a maximum reverse bias voltage applied across said collector and said emitter of said IGBT; a neutral region in said heavily doped region in said section of transit region near said neutral base region serves as a terminal of a primary power supply of said low-voltage circuit in said neutral base region.

\* \* \* \* \*